US012777980B2

(12) United States Patent
Ono et al.

(10) Patent No.: US 12,777,980 B2
(45) Date of Patent: Oct. 27, 2026

(54) HIGH FREQUENCY MODULE AND COMMUNICATION DEVICE

(71) Applicant: Murata Manufacturing Co., Ltd., Nagaokakyo (JP)

(72) Inventors: Atsushi Ono, Nagaokakyo (JP); Yoshiaki Sukemori, Nagaokakyo (JP); Yoshiki Kogushi, Nagaokakyo (JP); Hisanori Namie, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 446 days.

(21) Appl. No.: 18/459,421

(22) Filed: Sep. 1, 2023

(65) Prior Publication Data

US 2023/0411376 A1 Dec. 21, 2023

Related U.S. Application Data

(63) Continuation of application No. PCT/JP2022/008275, filed on Feb. 28, 2022.

(30) Foreign Application Priority Data

Mar. 2, 2021 (JP) ................................ 2021-033007

(51) Int. Cl.
*H10W 90/00* (2026.01)
*H10W 20/20* (2026.01)
(Continued)

(52) U.S. Cl.
CPC .......... *H10W 90/00* (2026.01); *H10W 20/20* (2026.01); *H10W 70/611* (2026.01); (Continued)

(58) Field of Classification Search
CPC ... H10W 90/00; H10W 20/20; H10W 70/611; H10W 70/635
See application file for complete search history.

(56) References Cited

U.S. PATENT DOCUMENTS 12,107,616 B2 * 10/2024 Nakazawa .............. H03F 3/245
2018/0130761 A1 5/2018 Kim et al.
(Continued)

FOREIGN PATENT DOCUMENTS

CN 112470407 B * 4/2022 ............ H10W 74/10
CN 116964739 A * 10/2023 .......... H10W 20/212
(Continued)

OTHER PUBLICATIONS

International Search Report and Written Opinion mailed on May 24, 2022, received for PCT Application PCT/JP2022/008275, filed on Feb. 28, 2022, 11 pages including English Translation.

*Primary Examiner* — Laura M Menz
(74) *Attorney, Agent, or Firm* — XSENSUS LLP

(57) ABSTRACT

A high frequency module capable of improving a heat dissipation performance of a power amplifier includes a mounting board, a power amplifier, and a connection member. The mounting board has a first main surface facing a second main surface. The power amplifier is disposed on the second main surface of the mounting board. The connection member is connectable to an external board. The power amplifier includes a base material, a transistor, and a through via. The base material has a third main surface facing a fourth main surface, and the third main surface is disposed between the second main surface and the fourth main surface. The transistor is disposed on the third main surface of the base material. The through via is provided between the third main surface and the fourth main surface. The through via is connected to the connection member.

20 Claims, 13 Drawing Sheets

(51) Int. Cl.

| | |
|---|---|
| *H10W 70/60* | (2026.01) |
| *H10W 70/63* | (2026.01) |
| *H10W 72/20* | (2026.01) |
| *H10W 72/90* | (2026.01) |

(52) U.S. Cl.

CPC ........ *H10W 70/635* (2026.01); *H10W 72/244* (2026.01); *H10W 72/942* (2026.01); *H10W 90/724* (2026.01); *H10W 90/794* (2026.01)

(56) References Cited

U.S. PATENT DOCUMENTS

| | | | | |
|---|---|---|---|---|
| 2022/0021404 | A1* | 1/2022 | Horita | H03F 3/195 |
| 2023/0411376 | A1* | 12/2023 | Ono | H05K 1/0237 |
| 2023/0411377 | A1* | 12/2023 | Ono | H05K 1/0237 |

FOREIGN PATENT DOCUMENTS

| | | | | | |
|---|---|---|---|---|---|
| CN | 117121198 | A | * | 11/2023 | H10W 70/635 |
| CN | 118872055 | A | * | 10/2024 | H10W 90/00 |
| JP | 2009-176994 | A | | 8/2009 | |
| JP | 2020-102693 | A | | 7/2020 | |
| JP | 2020-102758 | A | | 7/2020 | |
| JP | 2020126921 | A | * | 8/2020 | H10W 74/117 |
| JP | 2021-072349 | A | | 5/2021 | |
| KR | 102446108 | B1 | * | 9/2022 | H10W 90/00 |
| WO | WO-2019181761 | A1 | * | 9/2019 | H10W 90/701 |
| WO | WO-2020071021 | A1 | * | 4/2020 | H04B 1/18 |
| WO | 2020/090557 | A1 | | 5/2020 | |
| WO | 2021/002454 | A1 | | 1/2021 | |
| WO | WO-2021215107 | A1 | * | 10/2021 | H10W 99/00 |
| WO | WO-2022118891 | A1 | * | 6/2022 | H10W 90/00 |
| WO | WO-2022185692 | A1 | * | 9/2022 | H10W 70/657 |
| WO | WO-2022186131 | A1 | * | 9/2022 | H10W 70/635 |
| WO | WO-2022186132 | A1 | * | 9/2022 | H10W 20/20 |
| WO | WO-2022209738 | A1 | * | 10/2022 | H04B 1/38 |
| WO | WO-2022209741 | A1 | * | 10/2022 | H03F 3/24 |
| WO | WO-2022209749 | A1 | * | 10/2022 | H10W 90/00 |
| WO | WO-2022220000 | A1 | * | 10/2022 | H10W 90/00 |
| WO | WO-2023176962 | A1 | * | 9/2023 | H10W 90/00 |

* cited by examiner

HIGH FREQUENCY MODULE AND COMMUNICATION DEVICE

This application is a continuation of international application no. PCT/JP2022/008275, filed Feb. 28, 2022, and which claims priority to Japanese application no. 2021-033007, filed Mar. 2, 2021. The entire contents of both prior applications are hereby incorporated by reference.

TECHNICAL FIELD

The present disclosure generally relates to a high frequency module and a communication device, and relates to a high frequency module including a power amplifier and a communication device including the high frequency module.

BACKGROUND ART

A high frequency module includes a mounting board, a power amplification component (power amplifier), a reception filter, a metal block, and a terminal (connection member). The power amplification component is disposed on a first main surface of the mounting board. The terminal, the reception filter, and the metal block are disposed on a second main surface of a module board. The power amplification component is connected to the metal block through a via in the mounting board. The metal block is connected to the terminal. In this high frequency module, heat generated in the power amplification component is dissipated to an external board, which is connected to the terminal, through the via, the metal block, and the terminal in the mounting board.

CITATION LIST

Patent Document
Patent Document 1: Japanese Unexamined Patent Application Publication No. 2020-126921

SUMMARY

Technical Problem

In the high frequency module described above, the heat generated in the power amplifier disposed on the first main surface of the mounting board is transferred and dissipated to the external board disposed on the second main surface side of the mounting board. As a result, a heat dissipation path of the heat generated in the power amplifier is long, and a heat dissipation performance of the power amplifier is decreased.

The present disclosure has been made in view of the above problems, and provides a high frequency module and a communication device capable of improving a heat dissipation performance of a power amplifier.

Solution to Problem

A high frequency module according to an exemplary aspect of the present disclosure includes a mounting board, a power amplifier, and a connection member. The mounting board has a first main surface facing a second main surface. The power amplifier is disposed on the second main surface of the mounting board. The connection member is connectable to an external board. The power amplifier includes a base material, a transistor, and a through via. The base material has a third main surface facing a fourth main surface, and the third main surface is disposed between the second main surface and the fourth main surface. The transistor is disposed on the third main surface of the base material. The through via is provided in the base material along a facing direction in which the third main surface faces the fourth main surface. The through via is connected to the connection member.

A communication device according to an exemplary aspect of the present disclosure includes the high frequency module and a signal processing circuit. The signal processing circuit processes a high frequency signal passing through the high frequency module.

Advantageous Effects

According to the present disclosure, there is an advantage that a heat dissipation performance of a power amplifier can be improved.

DETAILED DESCRIPTION

Figure 1:
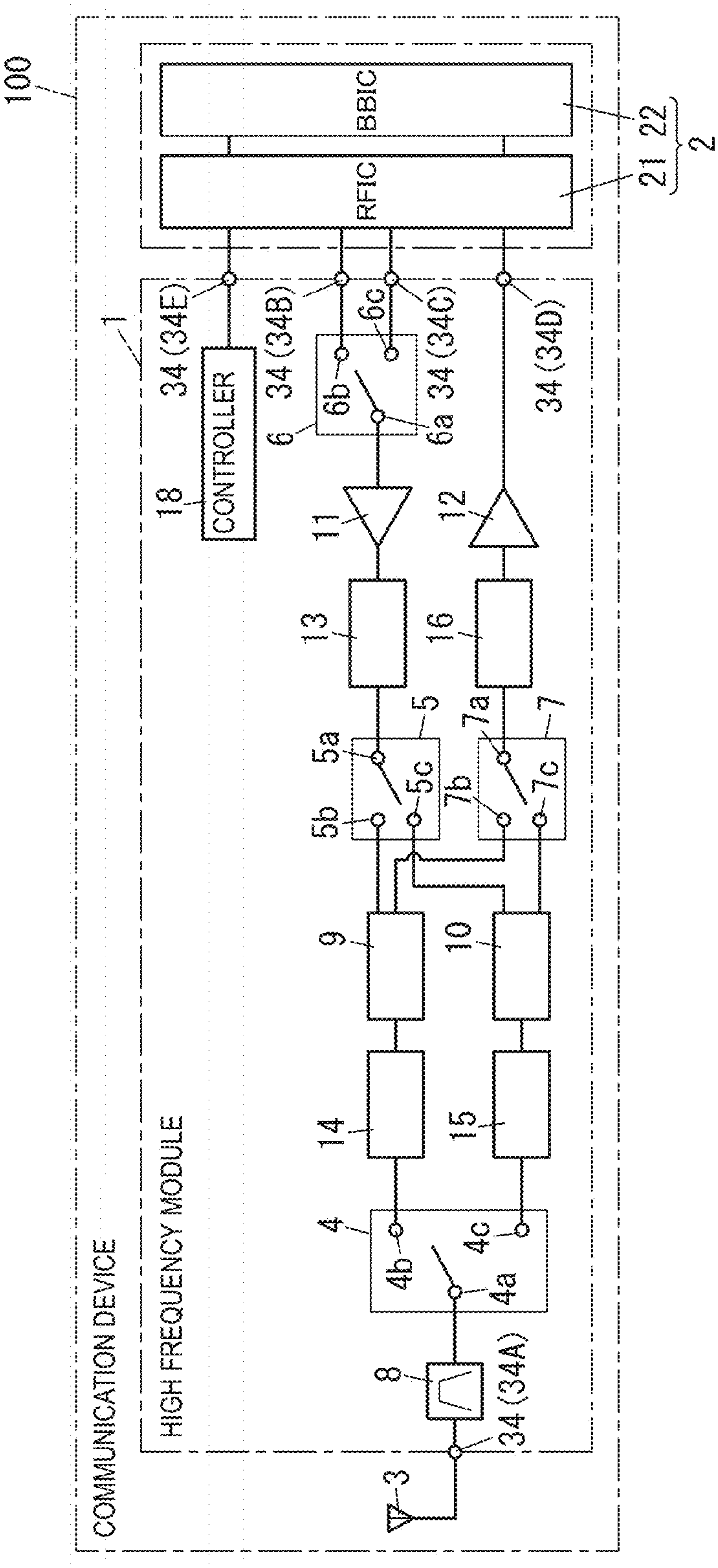
FIG. 1 is a block diagram of a high frequency module and a communication device according to an exemplary embodiment.

FIGS. 1 to 13 referred to in the following exemplary embodiments or the like are all schematic diagrams, and each of ratios of sizes and thicknesses between respective components in the drawing does not necessarily reflect the actual dimensional ratio.

Embodiment

(1) Overview

Figure 4:
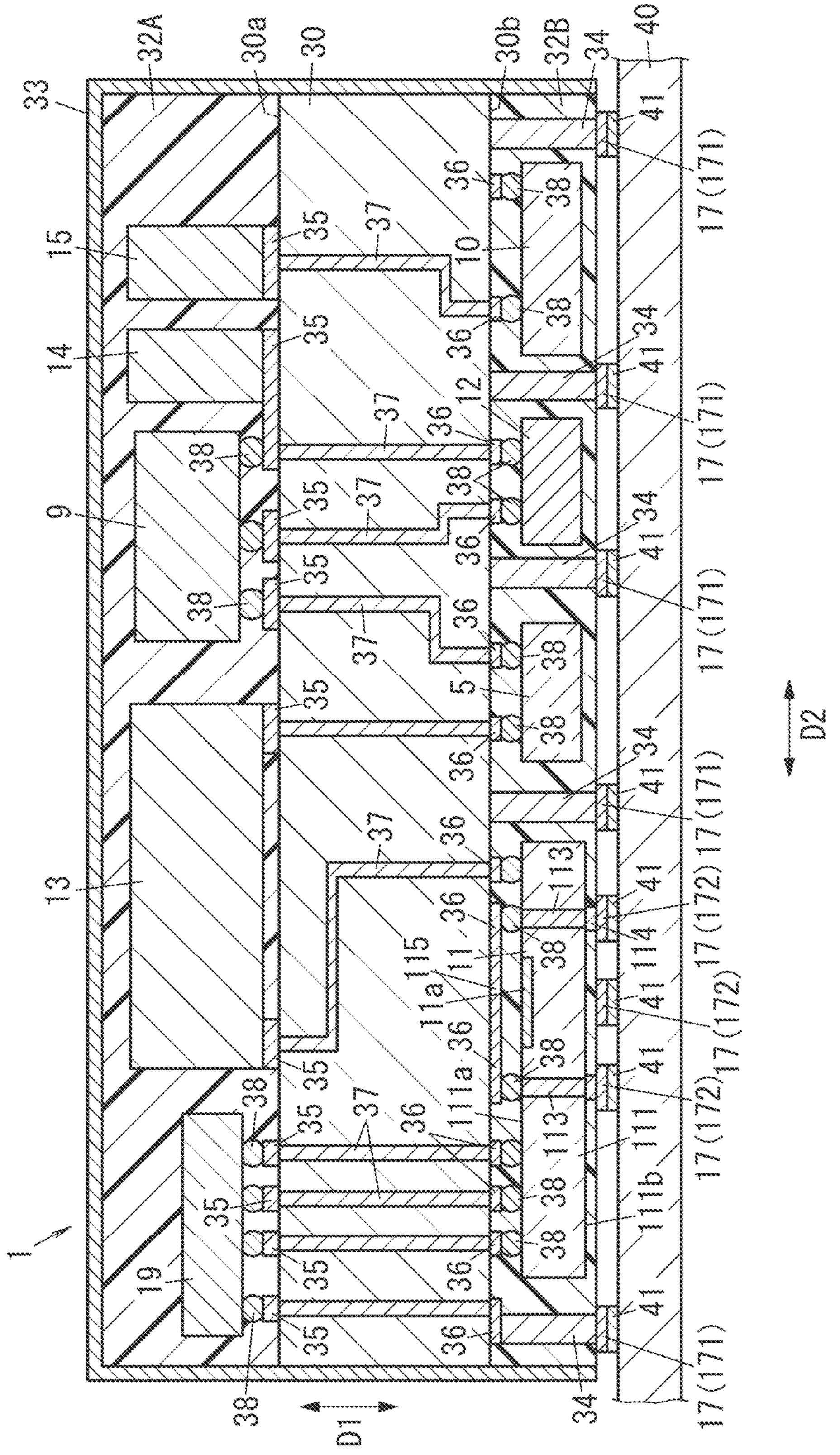
FIG. 4 is a sectional view taken along the line X1-X1 in FIG. 2 and the line X2-X2 in FIG. 3.

A high frequency module 1 according to an exemplary embodiment includes a mounting board 30, a power amplifier 11, and a connection member 172, as illustrated in FIG. 4. The mounting board 30 has a main surface 30*a* (first main surface) and a main surface 30*b* (second main surface) facing each other. The power amplifier 11 is disposed on the main surface 30*b* of the mounting board 30. The connection member 172 is connectable to an external board 40. The power amplifier 11 includes a base material 111, a transistor 11*a*, and a through via 113. The base material 111 has a main surface 111*a* (third main surface) and a main surface 111*b* (fourth main surface) facing each other. The main surface 111*a* of the base material 111 is disposed between the main surface 30*b* of the mounting board 30 and the main surface 111*b* of the base material 111. The transistor 11*a* is disposed on the main surface 111*a* of the base material 111. The through via 113 is provided in the base material 111 along a facing direction in which the main surface 111*a* faces the main surface 111*b*. Through via 113 is connected to the connection member 172.

According to this configuration, the power amplifier 11 is disposed on the main surface 30*b* of the mounting board 30 (that is, a main surface on a connection member 172 side). As a result, a heat dissipation path, through which heat generated in the power amplifier 11 (especially in the transistor 11*a*) is transferred to the external board 40, can be shortened as compared with the case where the power amplifier 11 is disposed on the main surface 30*a* of the mounting board 30 (that is, a main surface on a side opposite to the connection member 172 side). Further, the heat generated in the power amplifier 11 (especially in the transistor 11*a*) can be dissipated to the external board 40 connected to the connection member 172 through the through via 113 and the connection member 172. As a result, the heat generated in the transistor 11*a* can be efficiently (that is, rapidly) dissipated to the external board 40. Accordingly, the heat dissipation performance of the power amplifier 11 can be improved.

(2) Detailed Description

The high frequency module 1 and a communication device 100 according to the exemplary embodiment will be described in detail below with reference to FIGS. 1 to 5.

(2-1) Configuration of Communication Device

As illustrated in FIG. 1, the communication device 100 is a communication device that includes the high frequency module 1. The communication device 100 is, for example, a mobile terminal (for example, a smartphone), but is not limited to this, and may be, for example, a wearable terminal (for example, a smartwatch). The high frequency module 1 is a module compatible with, for example, a 4G (fourth generation mobile communication) standard and a 5G (fifth generation mobile communication) standard. The 4G standard is, for example, a 3GPP LTE standard (LTE: Long Term Evolution). The 5G standard is, for example, 5G NR (New Radio). The high frequency module 1 is a module compatible with carrier aggregation and dual connectivity.

The communication device 100 includes a signal processing circuit 2 and at least one antenna 3 (one in the illustrated example) in addition to the high frequency module 1.

The high frequency module 1 is configured to amplify a reception signal (high frequency signal) received by the antenna 3 and output the amplified reception signal to the signal processing circuit 2. The high frequency module 1 is controlled by the signal processing circuit 2, for example. The high frequency module 1 further has a signal processing function of a transmission system for amplifying a transmission signal from the signal processing circuit 2 and outputting the amplified transmission signal to the antenna 3.

The signal processing circuit 2 processes a high frequency signal (the transmission signal and the reception signal) passing through the high frequency module 1. More specifically, the signal processing circuit 2 is configured to perform signal processing on the reception signal received from the high frequency module 1. Further, the signal processing circuit 2 is configured to perform the signal processing on the transmission signal to be output to the high frequency module 1. The signal processing circuit 2 includes an RF signal processing circuit 21 and a baseband signal processing circuit 22.

The RF signal processing circuit 21 is, for example, a radio frequency integrated circuit (RFIC) and performs the signal processing on the high frequency signal (reception signal). The RF signal processing circuit 21, for example, performs the signal processing such as down-conversion on the reception signal, which is received from the high frequency module 1, and outputs the processed reception signal to the baseband signal processing circuit 22. Further, the RF signal processing circuit 21 performs the signal processing such as up-conversion on the transmission signal, which is output from the baseband signal processing circuit 22, and outputs the processed transmission signal to the high frequency module 1.

The baseband signal processing circuit 22 is, for example, a baseband integrated circuit (BBIC). The baseband signal processing circuit 22 outputs the reception signal, which is received from the RF signal processing circuit 21, to the outside. For example, this output signal (reception signal) is used as an image signal for image display or is used as an audio signal for voice call. Further, the baseband signal processing circuit 22 generates the transmission signal from a baseband signal (for example, the audio signal and the image signal) input from the outside and outputs the generated transmission signal to the RF signal processing circuit 21.

(2-2) Example of Circuit Configuration of High Frequency Module

As illustrated in FIG. 1, the high frequency module 1 transfers the high frequency signal (for example, a reception signal and a transmission signal) between the antenna 3 and the signal processing circuit 2.

The high frequency module 1 includes a first switch 4, a second switch 5, a third switch 6, a fourth switch 7, a transmission and reception filter 8, and a plurality of (two in FIG. 1) duplexers 9 and 10. Further, the high frequency module 1 includes the power amplifier 11, a low noise amplifier 12, an output matching circuit 13, a plurality of (three in FIG. 1) matching circuits 14 to 16, a controller 18, and a plurality of (five in FIG. 1) external connection terminals 34.

The plurality of external connection terminals 34 include an antenna terminal 34A, signal input terminals 34B and 34C, a signal output terminal 34D, and an input terminal 34E. The antenna terminal 34A is a terminal to which the antenna 3 is connected. The signal input terminals 34B and 34C are terminals for inputting transmission signals generated in the signal processing circuit 2 and are connected to respective output portions of the signal processing circuit 2. The signal output terminal 34D is a terminal for outputting the reception signal processed by the high frequency module 1 to the signal processing circuit 2 and is connected to an input portion of the signal processing circuit 2. The input terminal 34E is a terminal to which a control signal from the signal processing circuit 2 is input, and is connected to the output portion of the signal processing circuit 2.

The first switch 4 is a switch for selectively connecting two duplexers 9 and 10 to the antenna 3. The first switch 4 is, for example, a switch integrated circuit (IC). The first switch 4 includes a common terminal 4*a* and a plurality of (two in FIG. 1) selection terminals 4*b* and 4*c*. The common terminal 4*a* is connected to the antenna terminal 34A. That is, the common terminal 4*a* is connected to the antenna 3 with the antenna terminal 34A interposed therebetween. The selection terminal 4*b* is connected to the duplexer 9 with the matching circuit 14 interposed therebetween. The selection terminal 4*c* is connected to the duplexer 10 with the matching circuit 15 interposed therebetween. The first switch 4 selects a connection destination of the common terminal 4*a* (that is, a connection destination of the antenna 3) from among the two selection terminals 4*b* and 4*c* (that is, two duplexers 9 and 10) according to the control signal from the controller 18.

The second switch 5 is a switch for selectively connecting input portions of the two duplexers 9 and 10 to an output portion of the power amplifier 11. The second switch 5 is, for example, a switch IC. The second switch 5 includes a common terminal 5*a* and a plurality of (two in FIG. 1) selection terminals 5*b* and Sc. The common terminal 5*a* is connected to the output portion of the power amplifier 11 with the output matching circuit 13 interposed therebetween. The two selection terminals 5*b* and Sc are connected to the input portions of the duplexers 9 and 10, respectively. The second switch 5 selects a connection destination of the common terminal 5*a* from among the two selection terminals 5*b* and Sc according to the control signal from the controller 18.

The third switch 6 is a switch for selectively connecting the two signal input terminals 34B and 34C to the input portion of the power amplifier 11. The third switch 6 is, for example, a switch IC. The third switch 6 includes a common terminal 6*a* and a plurality of (two in FIG. 1) selection terminals 6*b* and 6*c*. The common terminal 6*a* is connected to the input portion of the power amplifier 11. The two selection terminals 6*b* and 6*c* are connected to the signal input terminals 34B and 34C, respectively. The third switch 6 selects a connection destination of the common terminal 6*a* from among the two selection terminals 6*b* and 6*c* according to the control signal from the controller 18.

The fourth switch 7 is a switch for selectively connecting output portions of the two duplexers 9 and 10 to an input portion of the low noise amplifier 12. The fourth switch 7 is, for example, a switch integrated circuit (IC). The fourth switch 7 includes a common terminal 7*a* and a plurality of (two in FIG. 1) selection terminals 7*b* and 7*c*. The common terminal 7*a* is connected to the input portion of the low noise amplifier 12 with the matching circuit 16 interposed therebetween. The selection terminals 7*b* and 7*c* are connected to the output portions of the duplexers 9 and 10, respectively. The fourth switch 7 selects a connection destination of the common terminal 7*a* from among the two selection terminals 7*b* and 7*c* according to the control signal from the controller 18.

The transmission and reception filter 8 is connected between the antenna terminal 34A and the common terminal 4*a* of the first switch 4. The transmission and reception filter 8 is a filter using a broadband communication band (first communication band) as a pass band. The transmission and reception filter 8 includes two input and output portions (a first input and output portion and a second input and output portion). The first input and output portion of the transmission and reception filter 8 is connected to the antenna terminal 34A. The second input and output portion of the transmission and reception filter 8 is connected to the common terminal 4*a* of the first switch 4. The transmission and reception filter 8 limits the transmission signal, which is input to the second input and output portion, to a signal in the first communication band and outputs the signal from the first input and output portion. Further, the transmission and reception filter 8 limits the reception signal, which is input to the first input and output portion, to a signal in the first communication band and outputs the signal from the second input and output portion.

The duplexer 9 is connected between the matching circuit 14, and the selection terminal 5*b* of the second switch 5 and the selection terminal 7*b* of the fourth switch 7. The duplexer 9 includes a transmission filter, which uses a transmission band (communication band) of a first communication band as a pass band, and a reception filter, which uses a reception band (communication band) of a second communication band as a pass band. The first communication band and the second communication band may be the same as each other, may be different from each other, or may partially overlap each other. The duplexer 9 includes the input and output portion, the input portion, and the output portion. The input and output portion of the duplexer 9 is connected to the selection terminal 4*b* of the first switch 4 with the matching circuit 14 interposed therebetween. The input portion of the duplexer 9 is connected to the selection terminal 5*b* of the second switch 5. The output portion of the duplexer 9 is connected to the selection terminal 7*b* of the fourth switch 7. The duplexer 9 limits the transmission signal, which is input to the input portion, to a signal in the transmission band of the first communication band and outputs the signal from the input and output portion. Further, the duplexer 9 limits the reception signal, which is input to the input and output portion, to a signal in the reception band of the second communication band and outputs the signal from the output portion.

The duplexer 10 is connected between the matching circuit 15, and the selection terminal Sc of the second switch 5 and the selection terminal 7*c* of the fourth switch 7. The duplexer 10 includes a transmission filter, which uses a transmission band (communication band) of a third communication band as a pass band, and a reception filter, which uses a reception band (communication band) of a fourth communication band as a pass band. The third communication band and the fourth communication band may be the same as each other, may be different from each other, or may partially overlap each other. The duplexer 10 includes the input and output portion, the input portion, and the output portion. The input and output portion of the duplexer 10 is connected to the selection terminal 4*c* of the first switch 4 with the matching circuit 15 interposed therebetween. The input portion of the duplexer 10 is connected to the selection terminal Sc of the second switch 5. The output portion of the duplexer 10 is connected to the selection terminal 7*c* of the fourth switch 7. The duplexer 10 limits the transmission signal, which is input to the input portion, to a signal in the transmission band of the third communication band and outputs the signal from the input and output portion. Further, the duplexer 10 limits the reception signal, which is input to the input and output portion, to a signal in the reception band of the fourth communication band and outputs the signal from the output portion.

The transmission and reception filter 8 and the duplexers 9 and 10 are, for example, acoustic wave filters. The acoustic wave filter is, for example, a surface acoustic wave (SAW) filter that utilizes surface acoustic waves. The transmission and reception filter 8 and the duplexers 9 and 10 are not limited to the SAW filters, and may be, for example, bulk acoustic wave (BAW) filters other than the SAW filters.

The power amplifier 11 is connected between the common terminal 5*a* of the second switch 5 and the common terminal 6*a* of the third switch 6. The power amplifier 11 includes the input portion and the output portion. The input portion of the power amplifier 11 is connected to the common terminal 6*a* of the third switch 6. The output portion of the power amplifier 11 is connected to the common terminal 5*a* of the second switch 5 with the output matching circuit 13 interposed therebetween. The power amplifier 11 amplifies the transmission signal input to the input portion and outputs the transmission signal from the output portion. The power amplifier 11 is controlled by the control signal from the controller 18.

The low noise amplifier 12 is connected between the common terminal 7*a* of the fourth switch 7 and the signal output terminal 34D. The low noise amplifier 12 includes the input portion and the output portion. The input portion of the low noise amplifier 12 is connected to the common terminal 7*a* of the fourth switch 7 with the matching circuit 16 interposed therebetween. The output portion of the low noise amplifier 12 is connected to the signal output terminal 34D. The low noise amplifier 12 amplifies the reception signal input to the input portion and outputs the reception signal from the output portion. The low noise amplifier 12 is controlled by the control signal from controller 18.

The output matching circuit 13 is a circuit for impedance matching between the power amplifier 11 and the second switch 5 and is connected between the power amplifier 11 and the second switch 5. The matching circuit 14 is a circuit for impedance matching between the first switch 4 and the duplexer 9 and is connected between the first switch 4 and the duplexer 9. The matching circuit 15 is a circuit for impedance matching between the first switch 4 and the duplexer 10 and is connected between the first switch 4 and the duplexer 10. The matching circuit 16 is a circuit for impedance matching between the fourth switch 7 and the low noise amplifier 12 and is connected between the fourth switch 7 and the low noise amplifier 12.

The controller 18 is a control device that controls electronic components such as the power amplifier 11, the low noise amplifier 12, the first switch 4, the second switch 5, the third switch 6, and the fourth switch 7 according to the control signal from the signal processing circuit 2. The controller 18 is electrically connected to the above-mentioned electronic components. Further, the controller 18 is connected to the output portion of the signal processing circuit 2 with the input terminal 34E interposed therebetween. The controller 18 controls the electronic components according to the control signal that is input from the signal processing circuit 2 to the input terminal 34E.

(2-3) Operation of Communication Device

The operation of the communication device 100 will be described with reference to FIG. 1.

When a transmission signal is transmitted, the third switch 6 selects one output portion (for example, the output portion connected to the signal input terminal 34B) from among the two output portions (the output portions connected to the signal input terminals 34B and 34C) of the signal processing circuit 2. Further, one of the two duplexers 9 and 10 (for example, the duplexer 9) is selected by each of the first switch 4 and the second switch 5. As a result, the transmission signal, which is output from the output portion connected to, for example, the signal input terminal 34B, in the signal processing circuit 2 is transmitted from the antenna 3 via the third switch 6, the power amplifier 11, the output matching circuit 13, the second switch 5, the duplexer 9, the matching circuit 14, the first switch 4, and the transmission and reception filter 8.

When the antenna 3 receives a reception signal, the first switch 4 and the fourth switch 7 select one of the two duplexers 9 and 10 (for example, the duplexer 9). As a result, the reception signal received by the antenna 3 is input from the antenna 3 to the input portion connected to the signal output terminal 34D in the signal processing circuit 2 via the first switch 4, the matching circuit 14, the duplexer 9, the fourth switch 7, the matching circuit 16, and the low noise amplifier 12. The reception signal is then processed by the signal processing circuit 2.

(2-4) Example of Structure of High Frequency Module

Figure 2:
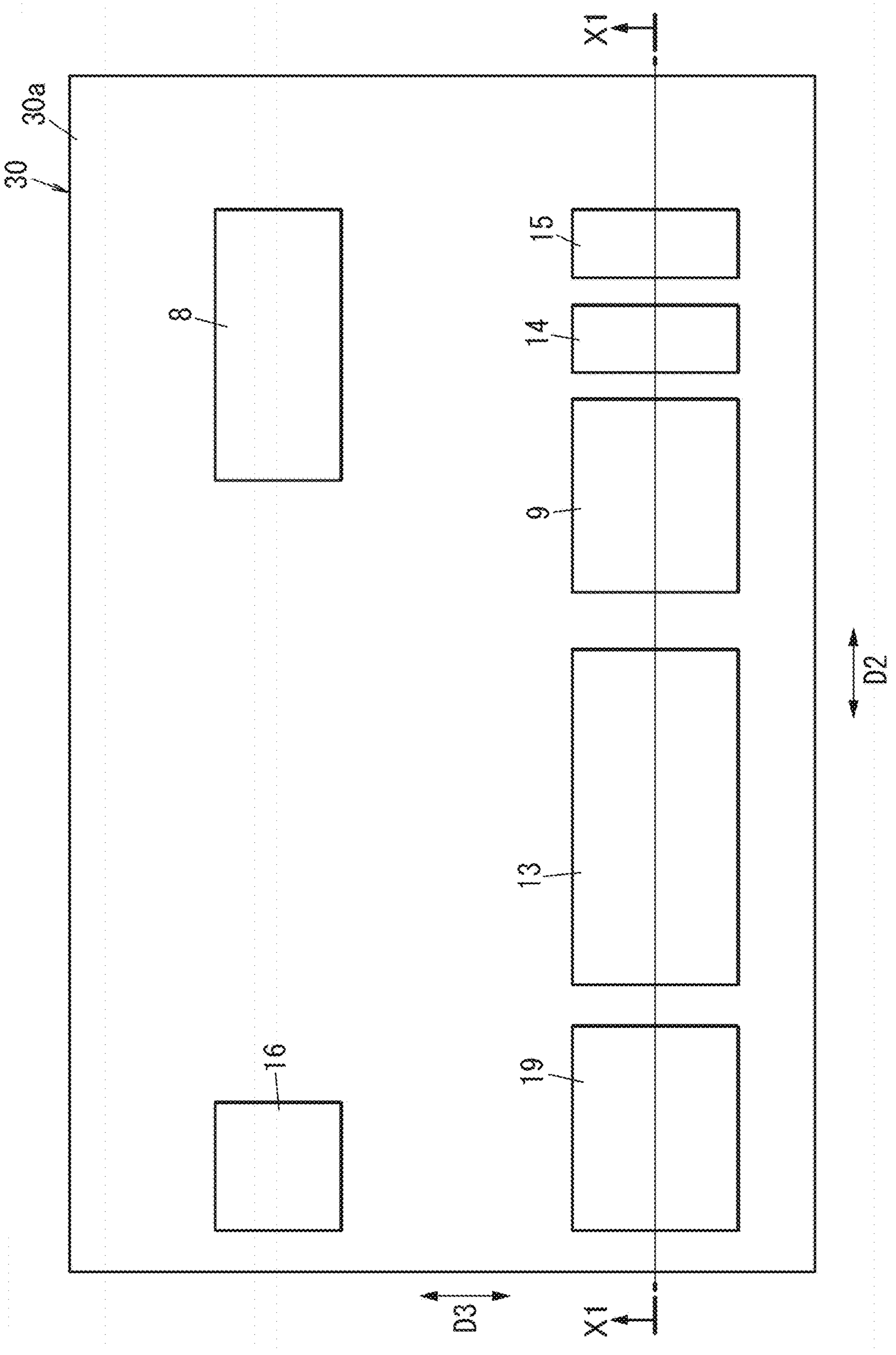
FIG. 2 is a plan view of a first main surface of a mounting board of the high frequency module according to the exemplary embodiment as viewed from a first main surface side.

An example of a structure of the high frequency module 1 will be described with reference to FIGS. 2 to 4.

In the following description, as illustrated in FIG. 4, a thickness direction D1 of the mounting board 30 may be referred to as a first direction D1. Further, as illustrated in FIG. 4, a certain direction orthogonal to the first direction D1 (for example, a direction parallel to one of two sets of opposite sides of the main surface 30*b* of the mounting board 30) is referred to as a second direction D2. Further, as illustrated in FIGS. 2 and 3, a direction orthogonal to both the first direction D1 and the second direction D2 (for example, a direction parallel to the other of the two sets of opposite sides of the main surface 30*b*) is referred to as a third direction D3.

Further, in FIG. 4, the upper side and the lower side of the paper surface in the first direction D1 may be simply referred to as an "upper side" and a "lower side". In FIGS. 2 to 4, the left side and the right side of the paper surface in the second direction D2 may be simply referred to as a "left side" and a "right side". In FIGS. 2 and 3, the upper side and the lower side of the paper surface in the third direction D3 may be simply referred to as a "rear side" and a "front side".

As illustrated in FIG. 4, the high frequency module 1 includes the mounting board 30, a plurality of electronic components, resin layers 32A and 32B, a shield layer 33, the plurality of external connection terminals 34, and a plurality of connection members 17.

The mounting board 30 is a board for mounting the plurality of electronic components, and has, for example, a rectangular plate shape. The mounting board 30 has the main surface 30*a* (first main surface) and the main surface 30*b* (first main surface) facing each other in the thickness direction D1 of the mounting board 30. The main surface 30*a* and the main surface 30*b* have a rectangular shape, for example.

The mounting board 30 is, for example, a board (multilayer board) having a plurality of layers including a plurality of dielectric layers and a plurality of conductive layers. The plurality of dielectric layers and the plurality of conductive layers are laminated in the thickness direction D1 of the mounting board 30. The plurality of conductive layers are formed in a predetermined pattern defined for each layer. The plurality of conductive layers include a ground layer.

The mounting board 30 is, for example, a low temperature co-fired ceramics (LTCC) board. The mounting board 30 is not limited to the LTCC board, and may be, for example, a printed wiring board, a high temperature co-fired ceramics (HTCC) board, or a resin multilayer board.

The mounting board 30 has a plurality of first pads 35, a plurality of second pads 36, and a plurality of vias 37. The plurality of first pads 35 are provided on the main surface 30*a* of the mounting board 30 and are connected to external terminals of the electronic components mounted on the main surface 30*a*. In the present specification and the like, "A (for example, the first pad) is connected to B (for example, the external terminal of the electronic component)" indicates that A and B are in contact with each other and also includes that A and B are electrically connected to each other with a conductor electrode, a conductor terminal, a wiring line, other circuit components, or the like interposed therebetween. Further, the plurality of second pads 36 are provided on the main surface 30*b* of the mounting board 30 and are connected to external terminals of the electronic components mounted on the main surface 30*b*. The plurality of vias 37 are provided inside the mounting board 30 and are through electrodes for connecting the first pad 35 and the second pad 36. The via 37 may extend straight through in the thickness direction D1 between the main surface 30*a* and the main surface 30*b* of the mounting board 30 or may extend between the main surface 30*a* and the main surface 30*b* of the mounting board 30 so as to be shifted along the conductive layer in the mounting board 30 in the thickness direction D1 of the mounting board 30. In the following description, the first pad 36 and the second pad 38 may be referred to as a metal member 36 and a metal member 38, respectively.

The plurality of electronic components includes the first switch 4, the second switch 5, the third switch 6, the transmission and reception filter 8, the duplexers 9 and 10, the power amplifier 11, the low noise amplifier 12, the output matching circuit 13, the matching circuits 14 and 15, the matching circuit 16, and an IC chip 19. The IC chip 19 is a semiconductor device including the controller 18 and the third switch 6 in one chip.

The plurality of electronic components are mounted on the main surface 30*a* (first main surface) or the main surface 30*b* (second main surface) of the mounting board 30.

In the present specification and the like, "mounted" includes that the electronic component is disposed on the main surface 30*a* or the main surface 30*b* of the mounting board 30 (mechanically connected), and that the electronic component is electrically connected to (an appropriate conductor portions of) the mounting board 30. Further, "A (for example, the electronic component) is mounted on the main surface 30*a* of the mounting board 30" means that A is directly mounted on the main surface 30*a*, and also means that A is disposed in a space on the main surface 30*a* side from among the space on the main surface 30*a* side and the space on the main surface 30*b* side separated by the mounting board 30. That is, "A (for example, the electronic component) is mounted on the main surface 30*a* of the mounting board 30" includes a fact that A is mounted on the main surface 30*a* with other circuit elements, electrodes, or the like interposed therebetween.

More specifically, the external terminal (not shown) of the electronic component mounted on the main surface 30*a* of the mounting board 30 is connected to the first pad 35 on the main surface 30*a* of the mounting board 30. At that time, depending on the electronic component, the external terminal of the electronic component is connected to the first pad 35 with the metal member (for example, a solder bump) 38 interposed therebetween. Further, the external terminal (not shown) of the electronic component mounted on the main surface 30*b* of the mounting board 30 is connected to the second pad 36 on the main surface 30*b* of the mounting board 30. At that time, depending on the electronic component, the external terminal of the electronic component is connected to the second pad 36 with the metal member 38 interposed therebetween.

More specifically, the IC chip 19, the output matching circuit 13, the duplexer 9, the matching circuits 14 to 16, and the transmission and reception filter 8 are mounted on the main surface 30*a* of the mounting board 30. In the example in FIG. 2, the IC chip 19, the output matching circuit 13, the duplexer 9, and the matching circuits 14 and 15 are arranged in this order on the main surface 30*a* of the mounting board 30 from a left end side to a right end side in the second direction D2. Further, the IC chip 19, the output matching circuit 13, the duplexer 9, and the matching circuits 14 and 15 are disposed in a front half region of the main surface 30*a* of the mounting board 30 in the third direction D3. The matching circuit 16 is disposed on the rear side of the IC chip 19 on the main surface 30*a* of the mounting board 30. The transmission and reception filter 8 is disposed on the rear side of the matching circuits 15 and 16 on the main surface 30*a* of the mounting board 30.

Returning to FIG. 4, the power amplifier 11, the second switch 5, the low noise amplifier 12, the duplexer 10, the first switch 4, and the plurality of external connection terminals 34 are mounted on the main surface 30*b* of the mounting board 30. In the example in FIG. 3, the power amplifier 11, the second switch 5, the low noise amplifier 12, and the duplexer 10 are arranged in this order on the main surface 30*b* of the mounting board 30 from the left end side to the right end side in the second direction D2. Further, the power amplifier 11, the second switch 5, the low noise amplifier 12, and the duplexer 10 are disposed in a front half region of the main surface 30*b* of the mounting board 30 in the third direction D3. The first switch 4 is disposed on the rear side of the low noise amplifier on the main surface 30*b* of the mounting board 30.

As illustrated in FIG. 4, in the exemplary embodiment, the power amplifier 11 overlaps at least a portion of each of the output matching circuit 13 and the IC chip 19 in plan view seen from the thickness direction D1 of the mounting board 30. As a result, a wiring path between the output matching circuit 13 and the power amplifier 11 can be shortened as compared with the case where the output matching circuit 13 and the power amplifier 11 are disposed not to overlap each other in plan view seen from the thickness direction D1 of the mounting board 30. Similarly, a wiring path between the IC chip 19 and the power amplifier 11 can be shortened as compared with the case where the IC chip 19 and the power amplifier 11 are disposed not to overlap each other in plan view seen from the thickness direction D1 of the mounting board 30.

Figure 3:
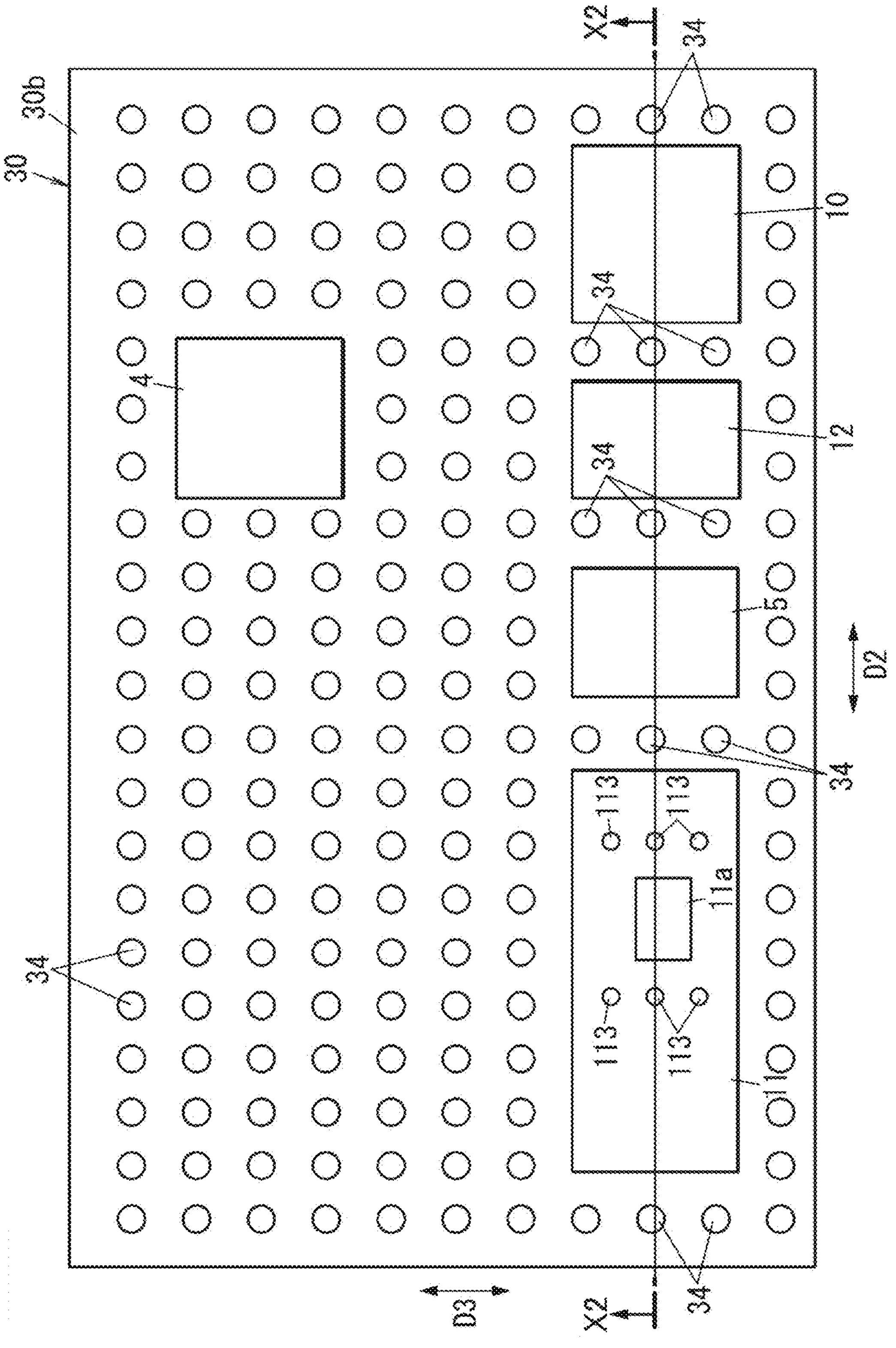
FIG. 3 is a plan view of a second main surface of the mounting board of the high frequency module according to the exemplary embodiment seen through from the first main surface side.

As illustrated in FIG. 3, the plurality of external connection terminals 34 are disposed in an empty region (that is, a region where the electronic components are not disposed) on the main surface 30*b* of the mounting board 30. The external connection terminal 34 has, for example, a columnar shape (for example, a cylindrical shape) and is disposed to protrude downward from the main surface 30*b* of the mounting board 30. A lower end surface of the external connection terminal 34 on a side opposite to the mounting board 30 is disposed further toward the side opposite to the mounting board 30 than a lower surface (a main surface on a side opposite to the mounting board 30 side) of the electronic component mounted on the main surface 30*b* of the mounting board 30.

As illustrated in FIG. 4, the resin layer 32A is provided on the main surface 30*a* of the mounting board 30. The resin layer 32A covers the entirety of each of the plurality of electronic components mounted on the main surface 30*a* of the mounting board 30. The resin layer 32B is provided on the main surface 30*b* of the mounting board 30. The resin layer 32B covers at least a portion of each of the plurality of electronic components and at least a portion of each of the plurality of external connection terminals 34 mounted on the main surface 30*b* of the mounting board 30. More specifically, the resin layer 32B covers the entirety of the plurality of electronic components mounted on the main surface 30*b* of the mounting board 30. The resin layer 32B covers the plurality of external connection terminals 34 such that the lower end surfaces thereof are exposed and other than the lower end surfaces thereof are covered. The resin layers 32A and 32B contain resin. However, the resin layers 32A and 32B may contain filler in addition to the resin. Materials of the resin layers 32A and 32B may be the same material or different materials.

The plurality of connection members 17 are connected to the external board 40 (for example, a mother board). That is, the plurality of connection members 17 are connectable to the external board 40. In the exemplary embodiment, the plurality of connection members 17 are mounted on the external board 40 with solders 41 interposed therebetween. The plurality of connection members 17 include connection members 171 and connection members 172. The connection member 171 is provided on a lower surface of the resin layer 32B (the main surface on a side opposite to the mounting board 30 side) to be in contact with the lower end surface of the external connection terminal 34. The connection member 171 is connected to the external connection terminal 34. The connection member 172 is provided on the lower surface of the resin layer 32B so as to be in contact with a lower surface of a metal member 114 of the power amplifier 11, which will be described later. The connection member 172 is connected to the metal member 114.

The shield layer 33 is made of metal, for example. The shield layer 33 is provided on an outer surface (an outer peripheral surface and a top surface) of the resin layer 32A, an outer peripheral surface of the resin layer 32B, and an outer peripheral surface of the mounting board 30. The shield layer 33 covers the entire outer surface of the resin layer 32A, the entire outer peripheral surface of the mounting board 30, and the entire outer peripheral surface of the resin layer 32B. The shield layer 33 is in contact with a ground layer of the mounting board 30. As a result, in the high frequency module 1, a potential of the shield layer 33 can be made the same as a potential of the ground layer (ground potential).

(2-5) Details of Configuration of Power Amplifier

As illustrated in FIG. 4, the power amplifier 11 includes the base material 111, a circuit portion (not shown), and the through via 113. Further, the high frequency module 1 includes the metal member 114 connected to a lower end surface of the through via 113 and a metal member 115 (second metal member) disposed on the main surface 30*b* of the mounting board 30.

The base material 111 has, for example, a rectangular plate shape. The base material 111 is formed of a member having an insulating property (for example, a gallium arsenide (GaAs) substrate, or a laminated substrate in which a gallium arsenide substrate and a silicon (Si) substrate are laminated). The base material 111 has a main surface 111*a* (third main surface) and a main surface 111*b* (fourth main surface) facing each other. The main surface 111*a* of the base material 111 is a main surface of the base material 111 on the mounting board 30 side. The main surface 111*b* of the base material 111 is a main surface of the base material 111 on a side opposite to the mounting board 30 side. The main surface 111*a* of the base material 111 is disposed between the main surface 30*b* of the mounting board 30 and the main surface 111*b* of the base material 111.

The circuit portion is a portion that constitutes a circuit of the power amplifier 11 and is disposed on the main surface 111*a* of the base material 111. The circuit portion includes a plurality of transistors. A final stage transistor 11*a* among the plurality of transistors is disposed on the main surface 111*a* of the base material 111. The final stage transistor 11*a* is a transistor used in an output stage circuit of the power amplifier 11. In other words, the final stage transistor 11*a* is a transistor included in a final processing stage (final stage) of a plurality of processing stages included in the power amplifier 11.

The through via 113 transfers heat generated in the power amplifier 11 (for example, the transistor 11*a*) from the main surface 111*a* side to the main surface 111*b* side of the power amplifier 11. The through via 113 extends through at least a portion of the base material 111 in the thickness direction (thickness direction D1) of the base material 111. That is, the through via 113 is provided in at least a portion of the base material 111 in a facing direction (thickness direction D1) in which the main surface 111*a* faces the main surface 111*b*. In the exemplary embodiment, the through via 113 extends through the entire base material 111 in the facing direction (thickness direction D1) in which the main surface 111*a* faces the main surface 111*b*. That is, the through via 113 extends between the main surface 111*a* and the main surface 111*b* of the base material 111. The through via 113 is provided in the base material 111 along the facing direction (thickness direction D1) in which the main surface 111*a* faces the main surface 111*b*. Note that, a case "the through via 113 is provided along the facing direction" is not limited to the case where a central axis of the through via 113 coincides with the facing direction, and also includes the case where the central axis of the through via 113 deviates from the facing direction by a slight angle (for example, an angle within 45 degrees).

The through via 113 is formed of a member having a thermal conductive property (for example, silicon). The through via 113 has, for example, a columnar shape (for example, cylindrical shape). An upper end surface (an end surface on the main surface 111*a* side) of the through via 113 is connected to the second pad 36 of the mounting board 30 with the metal member 38 interposed therebetween. The lower end surface (an end surface on the main surface 111*b* side) of the through via 113 is connected to the connection member 172 (17) with the metal member 114 interposed therebetween. The through via 113 is disposed around the final stage transistor 11*a*. In the example in FIG. 4, the through vias 113 are disposed on both sides of the transistor 11*a* in the second direction D2. More specifically, a plurality of through vias 113 are arranged on each of both sides of the transistor 11*a* in the second direction D2 along the third direction D3. The third direction D3 is a direction that intersects (for example, is orthogonal to) the second direction D2.

In the exemplary embodiment, the through via 113 is connected by being in contact with the metal member 38. The "connection" in this case includes thermal connection between the through via 113 and the metal member 38. Here, "A and B are thermally connected" means that A and B are connected to each other in a thermally conducting manner. Therefore, the above-mentioned "connection" includes not only the case where the through via 113 and the metal member 38 are connected by being in contact with each other but also the case where the through via 113 and the metal member 38 are connected to each other in a thermally conducting manner with a thermal conductive member interposed therebetween. The thermal conductive member is a member having a thermal conductive property. Further, in the exemplary embodiment, the through via 113 is connected to the connection member 172 with the metal member 114 interposed therebetween. The "connection" in this case also includes the case where the through via 113 and the connection member 172 are thermally connected to each other as described above. Therefore, the exemplary embodiment is not limited to the case where the through via 113 and the connection member 172 are connected to each other with the metal member 114 (thermal conductive member) interposed therebetween, and the through via 113 and the connection member 172 may be connected to each other by being in contact with each other.

In the exemplary embodiment, the connection member 172 and the through via 113 of the power amplifier 11 are connected with the metal member 114 interposed therebetween. From the above description, it can be seen that the connection member 172 and the power amplifier 11 are disposed on the same main surface (main surface 30*b*) of the two main surfaces 10*a* and 30*b* of the mounting board 30. Since the connection member 172 is a member connected to the external board 40, the connection member 172 is disposed on a rear surface (main surface 30*b*) of the mounting board 20. Accordingly, it can be seen that the power amplifier 11 is disposed on the main surface (that is, the rear surface), among the two main surfaces 30*a* and 30*b* of the mounting board 30, on a side where the external board 40 is connected.

In the exemplary embodiment, the power amplifier 11 is mounted on the main surface 30*b* of the mounting board 30 with a plurality of metal members 38 (first metal members) interposed therebetween. The upper end surface (the end surface on the main surface 111*a* side) of the through via 113 is connected to one of the plurality of metal members 38. More specifically, the through via 113 is connected to the metal member 38 closest to the transistor 11*a* among the plurality of metal members 38 in plan view seen from the thickness direction D1 of the mounting board 30. Alternatively, the through via 113 is connected to the metal member 38 adjacent to the transistor 11*a* in plan view seen from the thickness direction D1 of the mounting board 30. The "metal member 38 adjacent to the transistor 11*a*" is the metal member 38 that is arranged side by side with the transistor 11*a* without another metal member 38 interposed between the transistor 11*a* and the metal member 38.

The metal member 115 (second metal member) is a member for transferring heat, which is transferred from the transistor 11*a* of the power amplifier 11 to the main surface 30*b* of the mounting board 30 through the resin layer 32B, to the metal member 38 connected to the through via 113. The metal member 115 is disposed on the main surface 30*b* of the mounting board 30 in a region facing the transistor 11*a*. The metal member 115 has, for example, a flat plate shape. The metal member 115 has, for example, a shape (for example, a rectangular shape) that is large enough to cover the entire transistor 11*a* in plan view seen from the thickness direction D1 of the mounting board 30. The metal member 115 is connected to the metal member 38 that is connected to the through via 113. In the example in FIG. 4, the metal member 115 is connected to the metal member 36 to which the through via 113 is connected, and thereby the metal member 115 is connected, with the metal member 36 interposed therebetween, to the metal member 38 connected to the through via 113. In the example in FIG. 4, the metal member 115 is formed integrally with the metal member 36.

The metal member 114 is a member that connects the lower end surface (the end surface on the main surface 111*b* side) of the through via 113 and the connection member 17 (172) on the lower surface of the resin layer 32B. The metal member 114 is disposed between the power amplifier 11 and the connection member 172 and is connected to the connection member 172. The metal member 114 has, for example, a cylindrical shape. The metal member 114 is disposed on the main surface 111*b* of the base material 111 to be in contact with the through via 113. That is, the metal member 114 overlaps the through via 113 in plan view seen from the thickness direction D1 of the mounting board 30. The metal member 114 is covered with the resin layer 32B such that the lower surface (the main surface on a side opposite to the mounting board 30 side) thereof is exposed. The metal member 114 is connected to the connection member 172 that is disposed on the lower surface of the resin layer 32B (the main surface on a side opposite to the mounting board 30 side).

(2-6) Disposition of External Connection Terminal

As illustrated in FIGS. 3 and 4, in the exemplary embodiment, the external connection terminal 34 is disposed between the power amplifier 11 and the second switch 5 on the main surface 30*b* of the mounting board 30, and the external connection terminal 34 is connected to the connection member 17 (171). That is, the plurality of external connection terminals 34 include the external connection terminal 34 (first external connection terminal) that is connected to the connection member 17, and the external connection terminal 34 (first external connection terminal) is disposed between the power amplifier 11 and the second switch 5 on the main surface 30*b* of the mounting board 30.

In the exemplary embodiment, "the external connection terminal 34 is disposed between two electronic components A and B" means that at least a portion of the external connection terminal 34 is disposed in a collective region of line segments, which connect any point in a region of the electronic component A and any point in a region of the electronic component B, in plan view seen from the thickness direction D1 of the mounting board 30. Based on this, for example, "the external connection terminal 34 is disposed between the power amplifier 11 and the second switch 5" means that at least a portion of the external connection terminal 34 is disposed in a collective region of line segments, which connect any point in a region of the power amplifier 11 and any point in a region of the second switch 5, in plan view seen from the thickness direction D1 of the mounting board 30.

The second switch 5 is disposed at a position adjacent to the power amplifier 11. Here, "the second switch 5 is disposed at a position adjacent to the power amplifier 11" means that no other electronic component is disposed between the second switch 5 and the power amplifier 11. The second switch 5 is disposed closest to the power amplifier 11 among the plurality of electronic components mounted on the main surface 30*b* of the mounting board 30 in plan view seen from the thickness direction D1 of the mounting board 30.

(2-7) Example of Heat Transfer (Flow) Generated in Power Amplifier

Figure 5:
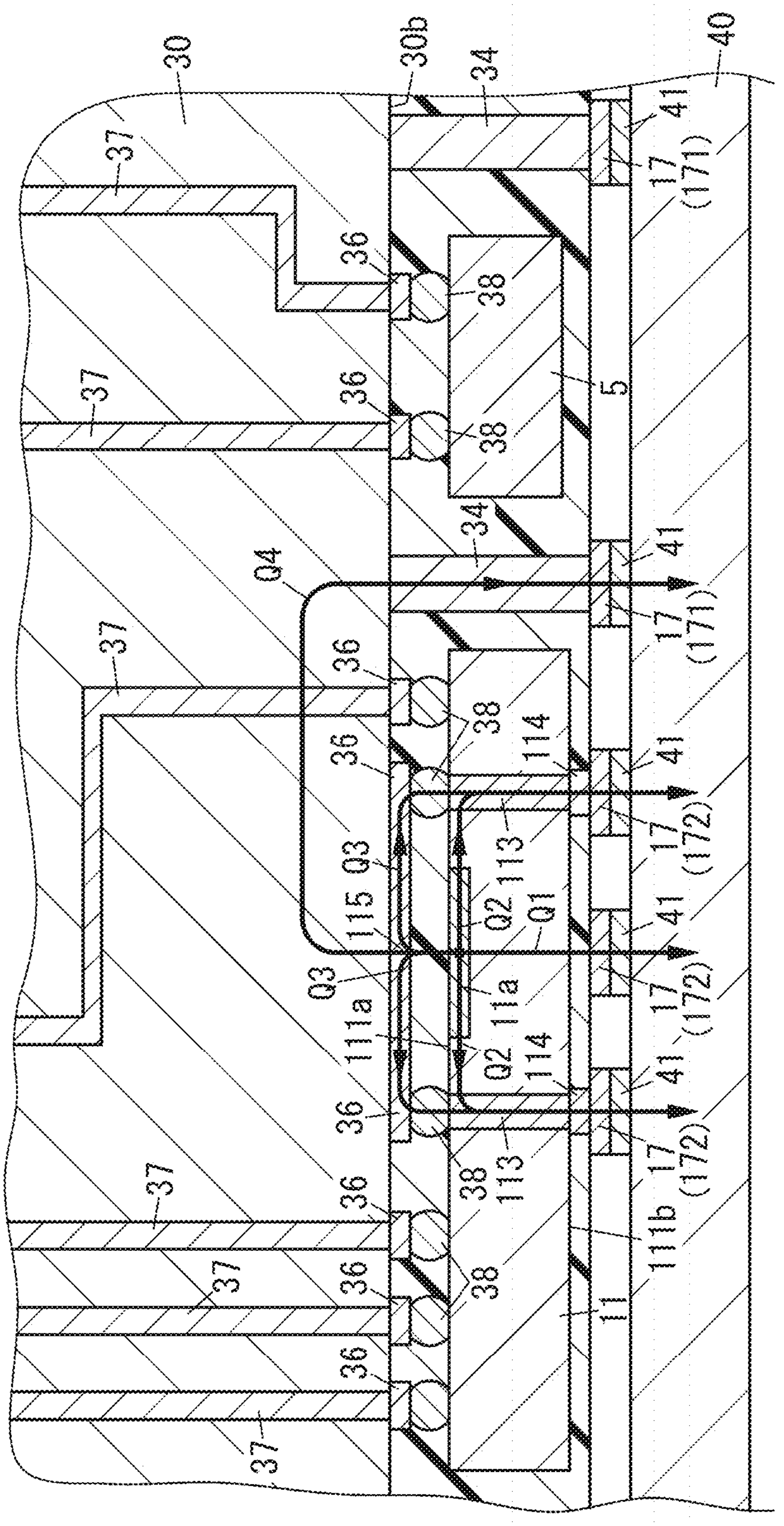
FIG. 5 is an explanatory diagram illustrating a flow of heat generated in a power amplifier in the high frequency module according to the exemplary embodiment.

As illustrated in FIG. 5, the power amplifier 11 is mounted on the main surface 30*b* of the mounting board 30. Therefore, part of heat Q1 (hereinafter, referred to as heat Q1) generated in the power amplifier 11 (for example, the transistor 11*a*) is transferred and dissipated to the external board 40 from the main surface 111*b* of the power amplifier 11 through the resin layer 32B and the connection member 172, for example. This heat dissipation path is shorter than a heat dissipation path through which heat of the power amplifier 11 is transferred to the external board 40 in the case where the power amplifier 11 is mounted on the main surface 30*a* of the mounting board 30. Therefore, the heat dissipation performance of the power amplifier 11 is improved as compared with the case where the power amplifier 11 is mounted on the main surface 30*a* of the mounting board 30.

Further, the power amplifier 11 is provided with the through via 113. As a result, part of heat Q2 (hereinafter, referred to as heat Q2) generated in the power amplifier 11 (for example, the transistor 11*a*) is transferred inside the power amplifier 11, reaches the through via 113, and is dissipated to the external board 40 through the through via 113, the metal member 114, and the connection member 172 (17). As a result, the heat Q2 generated in the power amplifier (for example, the transistor 11*a*) can be efficiently (that is, rapidly) dissipated to the external board 40. As a result, the heat dissipation performance of the power amplifier 11 can be further improved. More specifically, the plurality of through vias 113 are disposed on each of both sides of the transistor 11*a*. Therefore, the heat Q2 generated in the power amplifier 11 can be more efficiently dissipated to the external board 40 by the plurality of through vias 113.

Further, the metal member 115 is provided on the main surface 30*b* of the mounting board 30. As a result, part of heat Q3 (hereinafter, referred to as heat Q3) generated in the power amplifier 11 (for example, the transistor 11*a*) is transferred to the metal member 115 of the mounting board 30 through the resin layer 32B, is transferred through the metal member 115, the metal member 36, the metal member 38, the through via 113, the metal member 114, and the connection member 17 (172) in order, and dissipated to the external board 40. As a result, the heat Q3 transferred from the power amplifier 11 to the mounting board 30 through the resin layer 32B can be efficiently (rapidly) dissipated to the external board 40. As a result, the heat dissipation performance of the power amplifier 11 can be further improved. More specifically, as described above, the plurality of through vias 113 are disposed on each of both sides of the transistor 11*a*. The plurality of through vias 113 are connected to the metal member 115 with the metal members 36 and 38 interposed therebetween. Therefore, the heat Q3 transferred from the power amplifier 11 to the metal member 115 of the mounting board 30 through the resin layer 32B can be more efficiently dissipated to the external board 40 by the plurality of through vias 113.

Further, the external connection terminal 34 (first external connection terminal) connected to the connection member 171 is disposed between the power amplifier 11 and the second switch 5 (first electronic component). Part of the heat Q3 (hereinafter, referred to as heat Q4) transferred to the mounting board 30 diffuses in the mounting board 30 in a direction parallel to the main surface 30*b*. Part of the diffused heat Q4 passes through the external connection terminal 34, which is positioned between the power amplifier 11 and the second switch 5, and the connection member 171 (17) in order and is transferred and dissipated to the external board 40 connected to the connection member 17. As a result, the heat Q4 transferred from the power amplifier 11 to the mounting board 30 through the resin layer 32B is suppressed from being transferred to the second switch 5. As a result, the influence of the heat Q4 generated in the power amplifier 11 on the second switch 5 is suppressed.

More specifically, as illustrated in FIG. 3, the plurality of external connection terminals 34 are disposed between the power amplifier 11 and the second switch 5. The plurality of external connection terminals 34 are arranged in a direction (third direction D3) intersecting (for example, orthogonal to) a direction (second direction D2) in which the power amplifier 11 and the second switch 5 are arranged in plan view seen from the thickness direction D1 of the mounting board 30. As a result, the influence of the heat Q4 generated in the power amplifier 11 on the second switch 5 is further suppressed by the plurality of external connection terminals 34 disposed between the power amplifier 11 and the second switch 5.

Further, the influence of the heat Q4 generated in the power amplifier 11 on other electronic components (for example, the low noise amplifier 12 and duplexer 10) mounted on the main surface 30*b* of the mounting board 30 is also suppressed by the external connection terminal 34 disposed between the power amplifier 11 and the second switch 5.

Similarly, the plurality of external connection terminals 34 connected to the connection members 171 are also disposed between the second switch 5 and the low noise amplifier 12. Similarly to the plurality of external connection terminals 34 disposed between the power amplifier 11 and the second switch 5, the influence of the heat Q4 generated in the power amplifier 11 on the low noise amplifier 12 is also suppressed by the plurality of external connection terminals 34. Similarly, the plurality of external connection terminals 34 connected to the connection members 171 are also disposed between the low noise amplifier 12 and the duplexer 10. The influence of the heat Q4 generated in the power amplifier 11 on the duplexer 10 is also suppressed by the plurality of external connection terminals 34. Similarly, the plurality of external connection terminals 34 connected to the connection members 171 are also disposed between the power amplifier and the first switch 4. The influence of the heat Q4 generated in the power amplifier 11 on the first switch 4 is also suppressed by the plurality of external connection terminals 34.

Further, as described above, the heat Q2 and Q3 generated in the power amplifier 11 is efficiently (that is, rapidly) transferred and dissipated to the external board 40 through the through via 113, the metal member 114, and the connection member 172 (17) in order. As a result, a flow rate of heat Q4 transferred from the power amplifier 11 to the mounting board 30 is suppressed. As a result, the influence of the heat Q4 generated in the power amplifier 11 on the second switch 5 is further suppressed. Further, since the heat Q1 to Q3 of the power amplifier 11 is dissipated to the external board 40 without bypassing the external connection terminals 34, the heat dissipation performance of the power amplifier 11 is improved.

(3) Main Effects

A high frequency module 1 according to the present exemplary embodiment includes a mounting board 30, a power amplifier 11, and a connection member 172. The mounting board 30 has a main surface 30*a* (first main surface) and a main surface 30*b* (second main surface) facing each other. The power amplifier 11 is disposed on the main surface 30*b* of the mounting board 30. The connection member 17 is connectable to an external board 40. The power amplifier 11 includes a base material 111, a transistor 11*a*, and a through via 113. The base material 111 has a main surface 111*a* (third main surface) and a main surface 111*b* (fourth main surface) facing each other. The main surface 111*a* of the base material 111 is disposed between the main surface 30*b* (fourth main surface) of the mounting board 30 and the main surface 111*b* of the base material 111. The transistor 11*a* is disposed on the main surface 111*a* of the base material 111. The through via 113 is provided in the base material 111 along a facing direction in which the main surface 111*a* faces the main surface 111*b*. Through via 113 is connected to the connection member 17.

According to this configuration, the power amplifier 11 is disposed on the main surface 30*b* of the mounting board 30 (a main surface on a connection member 17 side). As a result, the heat dissipation path, through which the heat generated in the transistor 11*a* is transferred to the external board 40, can be shortened as compared with the case where the power amplifier 11 is disposed on the main surface 30*a* of the mounting board 30. Further, the heat generated in the transistor 11*a* of the power amplifier 11 can be dissipated to the external board 40, which is connected to the connection member 17, through the through via 113 and the connection member 17. As a result, the heat generated in the transistor 11*a* can be efficiently (that is, rapidly) dissipated to the external board 40. Accordingly, the heat dissipation performance of the power amplifier 11 (especially the heat dissipation performance of the transistor 11*a*) can be improved.

(4) Modification Example

Modification examples of the above exemplary embodiment will be described. In the description below, the same components as those in the above exemplary embodiment are assigned the same reference numerals as those in the above exemplary embodiment and descriptions thereof are omitted, and the description will focus on elements that are different from the above exemplary embodiment. The modification examples described below may be implemented in combination.

(4-1) Modification Example 1

Figure 6:
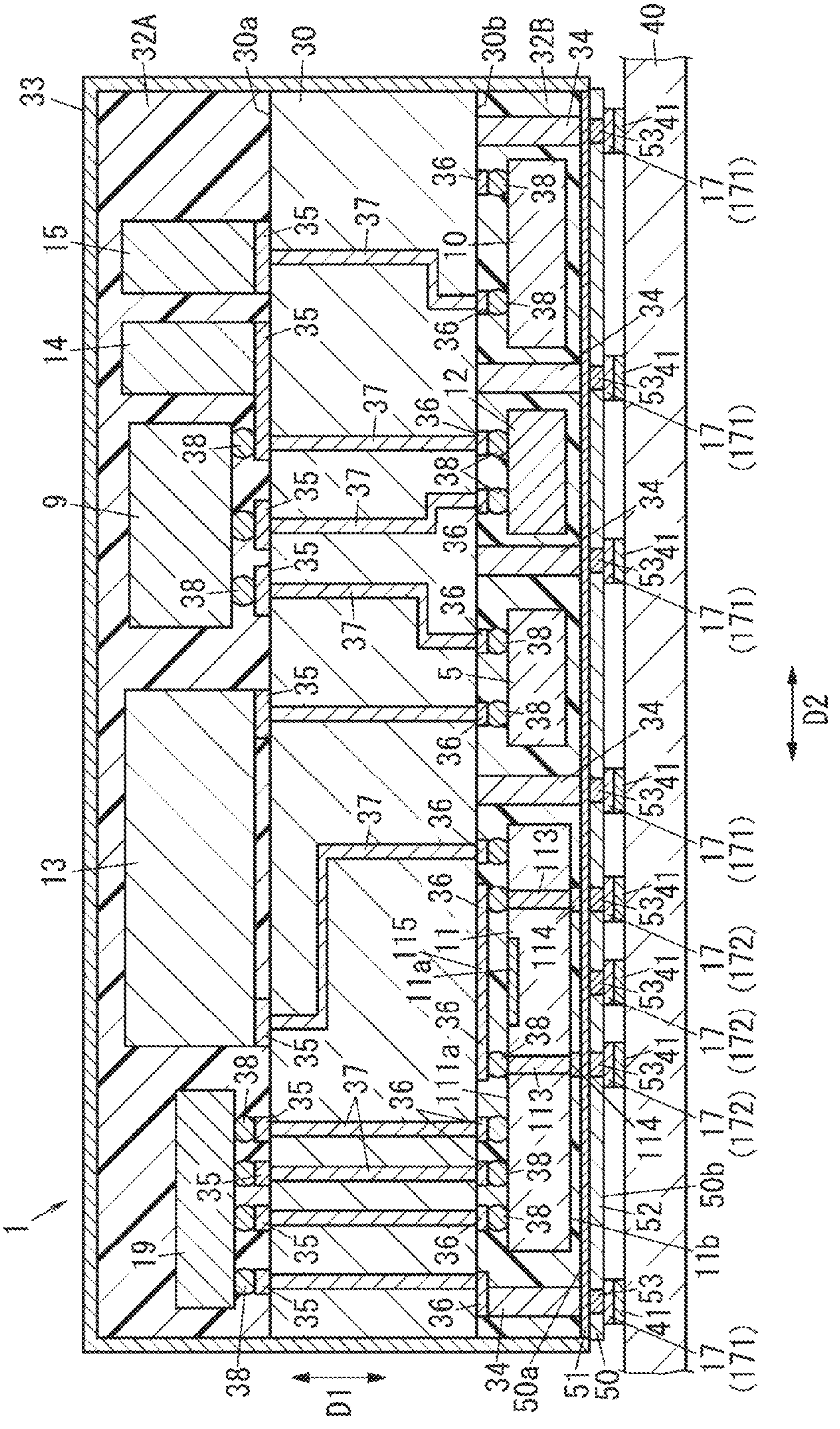
FIG. 6 is a sectional view of a main part of a high frequency module according to Modification Example 1.

As illustrated in FIG. 6, a high frequency module 1 in Modification Example 1 further includes a rewiring layer 50 (wiring layer) in the above exemplary embodiment.

The rewiring layer 50 is provided between the lower surface of the resin layer 32B (the main surface on a side opposite to the mounting board 30 side) and the connection member 17. The rewiring layer 50 has a main surface 50*a* (fifth main surface) and a main surface 50*b* (sixth main surface) facing each other on both sides in the thickness direction (thickness direction D1) of the rewiring layer 50. The main surface 50*a* of the rewiring layer 50 is the main surface of the rewiring layer 50 on the mounting board 30 side. The main surface 50*b* of the rewiring layer 50 is the main surface of the rewiring layer 50 on a side opposite to the mounting board 30 side. The plurality of external connection terminals 34 are disposed between the main surface 30*b* (second main surface) of the mounting board 30 and the main surface 50*a* (fifth main surface) of the rewiring layer 50. That is, the main surface 50*a* of the rewiring layer 50 is disposed between the main surface 30*b* of the mounting board 30 and the main surface 50*b* of the rewiring layer 50. Further, the main surface 50*a* of the rewiring layer 50 is disposed between the lower surface of the power amplifier 11 (the main surface on a side opposite to the mounting board 30 side) and the main surface 50*b* of the rewiring layer 50. The plurality of connection members 17 are disposed on the main surface 50*b* of the rewiring layer 50.

The rewiring layer 50 includes a conductor layer 51, a substrate 52, and a via 53.

The conductor layer 51 is a layer forming a conductive path (wiring). The conductor layer 51 is provided on the lower surface of the resin layer 32B so as to have a predetermined pattern. The conductor layer 51 is in contact with lower end surfaces (the end surfaces on a side opposite to the mounting board 30 side) of the plurality of external connection terminals 34 and a lower end surface (the end surface on a side opposite to the mounting board 30 side) of the metal member 114.

The substrate 52 is formed of an insulating member (for example, dielectric). The substrate 52 has, for example, a flat plate shape thinner than the mounting board 30. The substrate 52 is provided on the lower surface of the resin layer 32B so as to cover the entire lower surface of the resin layer 32B. The main surfaces on both sides of the substrate 52 in the thickness direction D1 constitute main surfaces 50*a* and 50*b* on both sides of the rewiring layer 50. The conductor layer 51 is provided between the resin layer 32B and the substrate 52.

The via 53 is, for example, a conductor member having a columnar shape (for example, a cylindrical shape) and is provided in the substrate 52 so as to extend through the substrate 52 in the thickness direction (thickness direction D1). The via 53 is in contact with the conductor layer 51 and the connection member 17 on the lower surface of the substrate 52 (the main surface on a side opposite to the mounting board 30 side). The via 53 is connected to the external connection terminal 34 or the metal member 114 with the conductor layer 51 interposed therebetween. The plurality of connection members 17 are disposed on the lower surface of the substrate 52 (that is, the main surface 50*b* of the rewiring layer 50).

The plurality of connection members 17 are mounted on the external board 40 with the solder 41 as in the above exemplary embodiment.

In the rewiring layer 50, each of the plurality of connection members 17 can be disposed to overlap or not to overlap the external connection terminal 34 or the metal member 114, which is connected to the connection member 17, in plan view seen from the thickness direction (thickness direction D1) of the substrate 52 by adjusting a shape of a pattern of the conductor layer 51 and a disposition of the via 53. By providing the rewiring layer 50 in this manner, a degree of freedom in disposing the plurality of connection members 17 on the main surface 50*b* of the rewiring layer 50 can be improved.

(4-2) Modification Example 2

Figure 7:
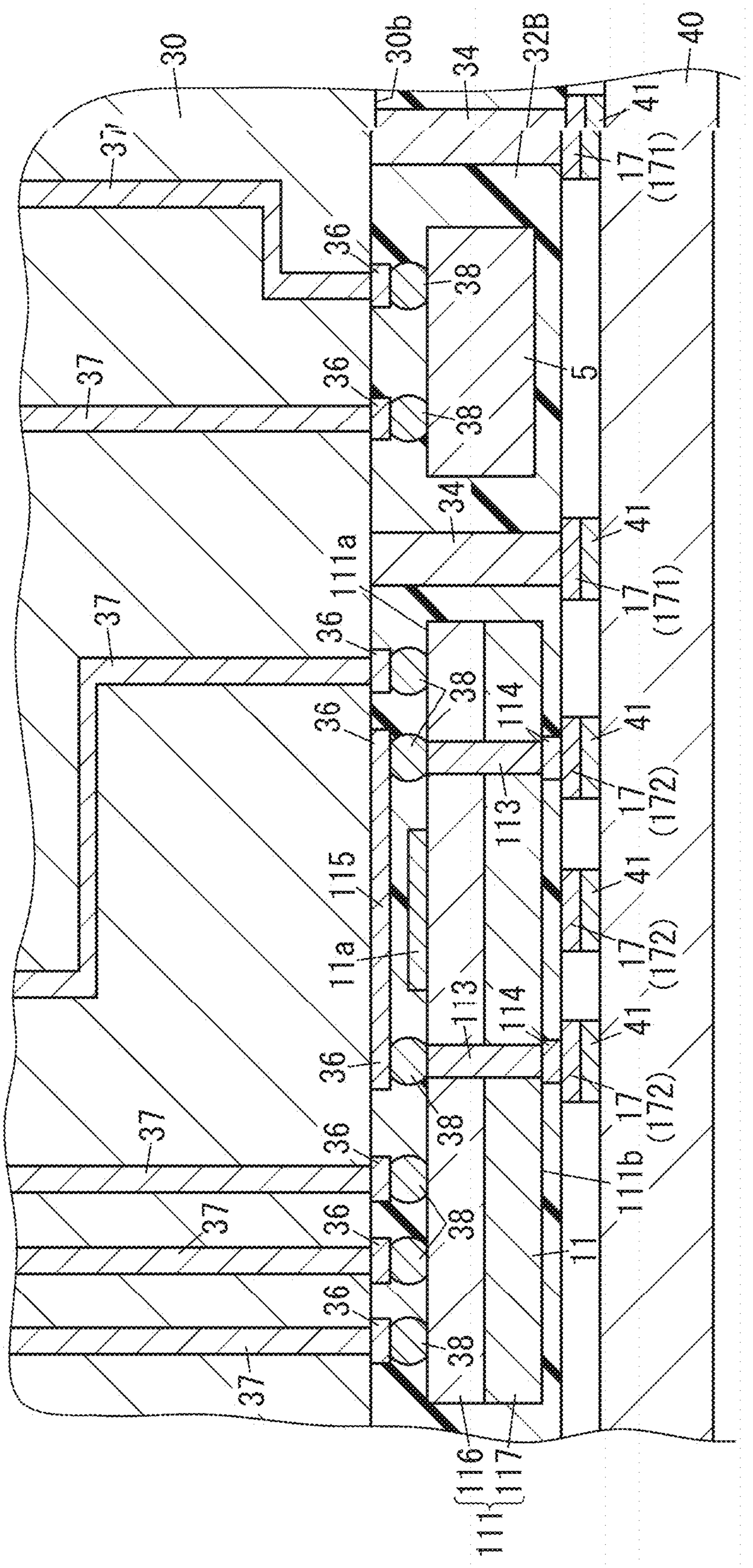
FIG. 7 is a sectional view of a main part of a high frequency module according to Modification Example 2.

As illustrated in FIG. 7, in Modification Example 2, in the above exemplary embodiment, the base material 111 of the power amplifier 11 includes a first substrate 116 and a second substrate 117 made of semiconductor materials (for example, gallium arsenide and silicon) that are different from each other.

The transistor 11*a* is provided on the first substrate 116. The second substrate 117 is laminated on the first substrate 116. The first substrate 116 is disposed between the main surface 30*b* (second main surface) of the mounting board 30 and the second substrate 117. A main surface of the first substrate 116 on the mounting board 30 side constitutes the main surface 111*a* of the base material 111. A main surface of the second substrate 117 on a side opposite to the first substrate 116 side constitutes the main surface 111*b* of the base material 111. In Modification Example 2, the through via 113 extends through at least one of the first substrate 116 and the second substrate 117 (both the first substrate 116 and the second substrate 117 in the example in FIG. 7) in the thickness direction (thickness direction D1) of the base material 111.

The first substrate 116 is made of a semiconductor material other than silicon. The above-mentioned semiconductor material is, for example, gallium arsenide (GaAs). However, the semiconductor material is not limited to gallium arsenide, and any one of gallium nitride (GaN), aluminum arsenide (AlAs), indium arsenide (InAs), indium phosphide (InP), gallium phosphide (GaP), indium antimonide (InSb), gallium nitride, indium nitride (InN), aluminum nitride (AlN), germanium (Ge), silicon carbide (SiC), and gallium (III) oxide ($Ga_2O_3$) may be used as a material other than gallium arsenide. The second substrate 117 is made of silicon.

According to Modification Example 2, since the base material 111 of the power amplifier 11 includes the second substrate 117 made of silicon, the second substrate 117 can improve the heat dissipation performance of the power amplifier 11. Further, since the through via 113 extends through both the first substrate 116 and the second substrate 117, the through via 113 can efficiently transfer the heat generated in the transistor 11*a* from the main surface 111*a* side to the main surface 111*b* side of the base material 111. Accordingly, the heat dissipation performance of the power amplifier 11 can be further improved.

Figure 8:
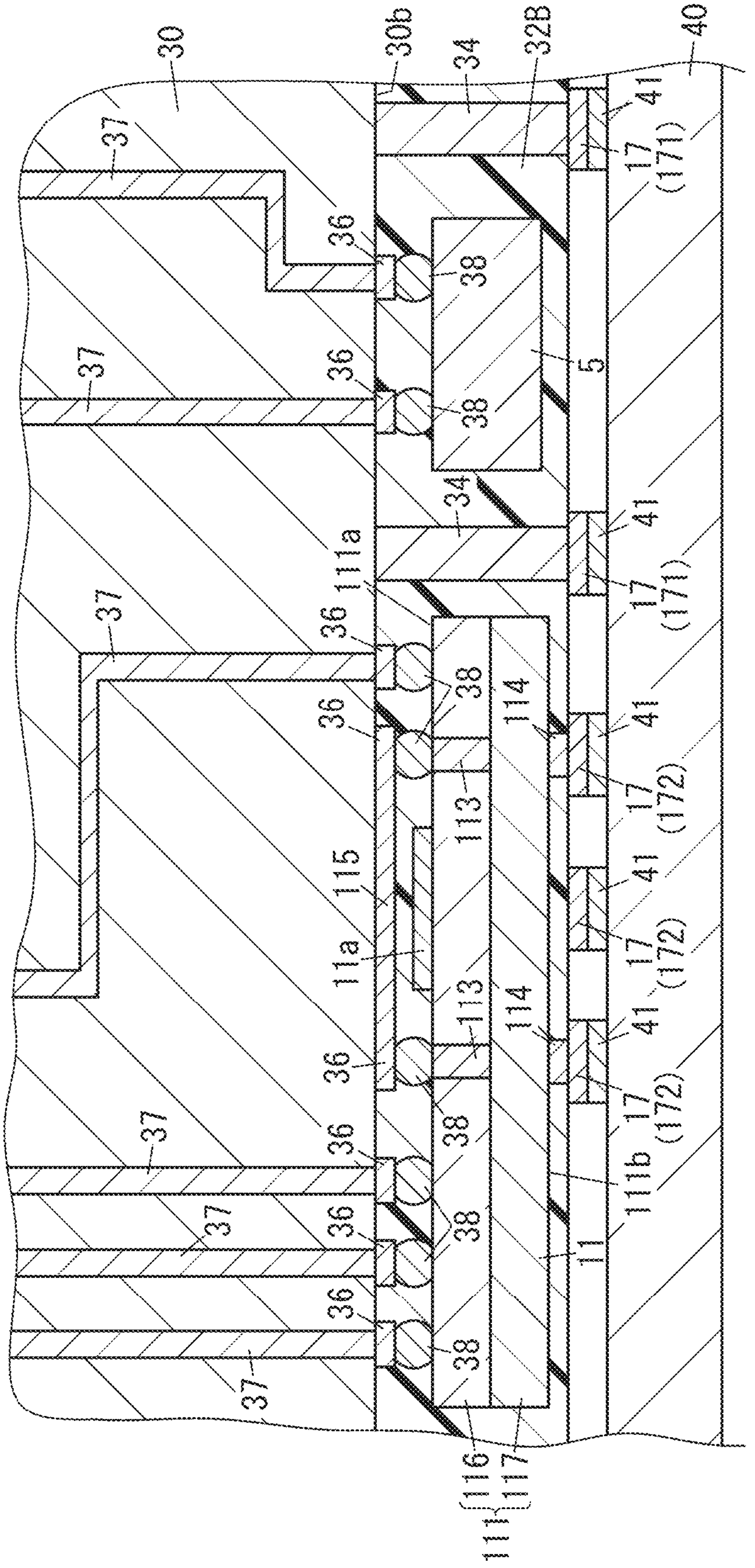
FIG. 8 is a sectional view of a main part of a high frequency module according to a modification example of Modification Example 2.
Figure 9:
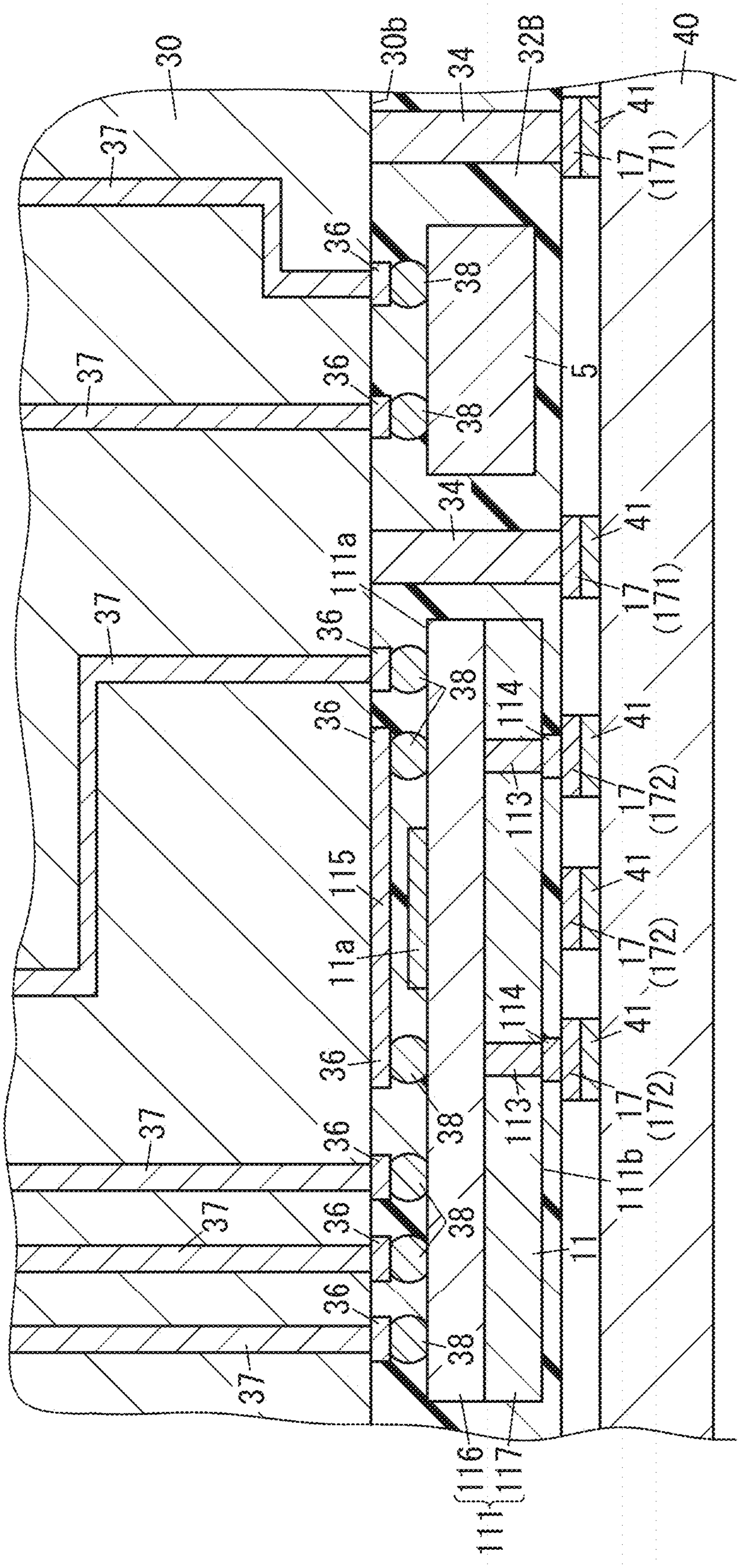
FIG. 9 is a sectional view of a main part of a high frequency module according to another modification example of Modification Example 2.

In Modification Example 2, although the through via 113 extends through both the first substrate 116 and the second substrate 117, the through via 113 may extend through only one of the first substrate 116 and the second substrate 117. FIG. 8 illustrates a case where the through via 113 extends through only the first substrate 116 among the first substrate 116 and the second substrate 117. In the example in FIG. 8, the lower surface of the through via 113 is connected to the connection member 172 (17) with the second substrate 117 and the metal member 114 interposed therebetween. That is, the through via 113 is connected to the connection member 172 with the thermal conductive member (the second substrate 117 and the metal member 114) interposed therebetween. An upper surface of the through via 113 is in contact with the metal member 38 and is connected thereto, as in the above exemplary embodiment. FIG. 9 illustrates a case where the through via 113 extends through only the second substrate 117 among the first substrate 116 and the second substrate 117. In the example in FIG. 9, the upper surface of the through via 113 is connected to the metal member 38 with the first substrate 116 (thermal conductive member) interposed therebetween. The lower surface of the through via 113 is connected to the connection member 172 with the metal member 114 (thermal conductive member) interposed therebetween, as in the above exemplary embodiment.

As illustrated in FIGS. 8 and 9, even when the through via 113 extends through only one of the first substrate 116 and the second substrate 117, the heat generated in the power amplifier 11 can be more efficiently transferred through the through via 113 in the substrate (first substrate 116 or second substrate 117) through which the through via 113 extends. Therefore, the heat dissipation performance of the power amplifier 11 can be further improved.

(4-3) Modification Example 3

Figure 10:
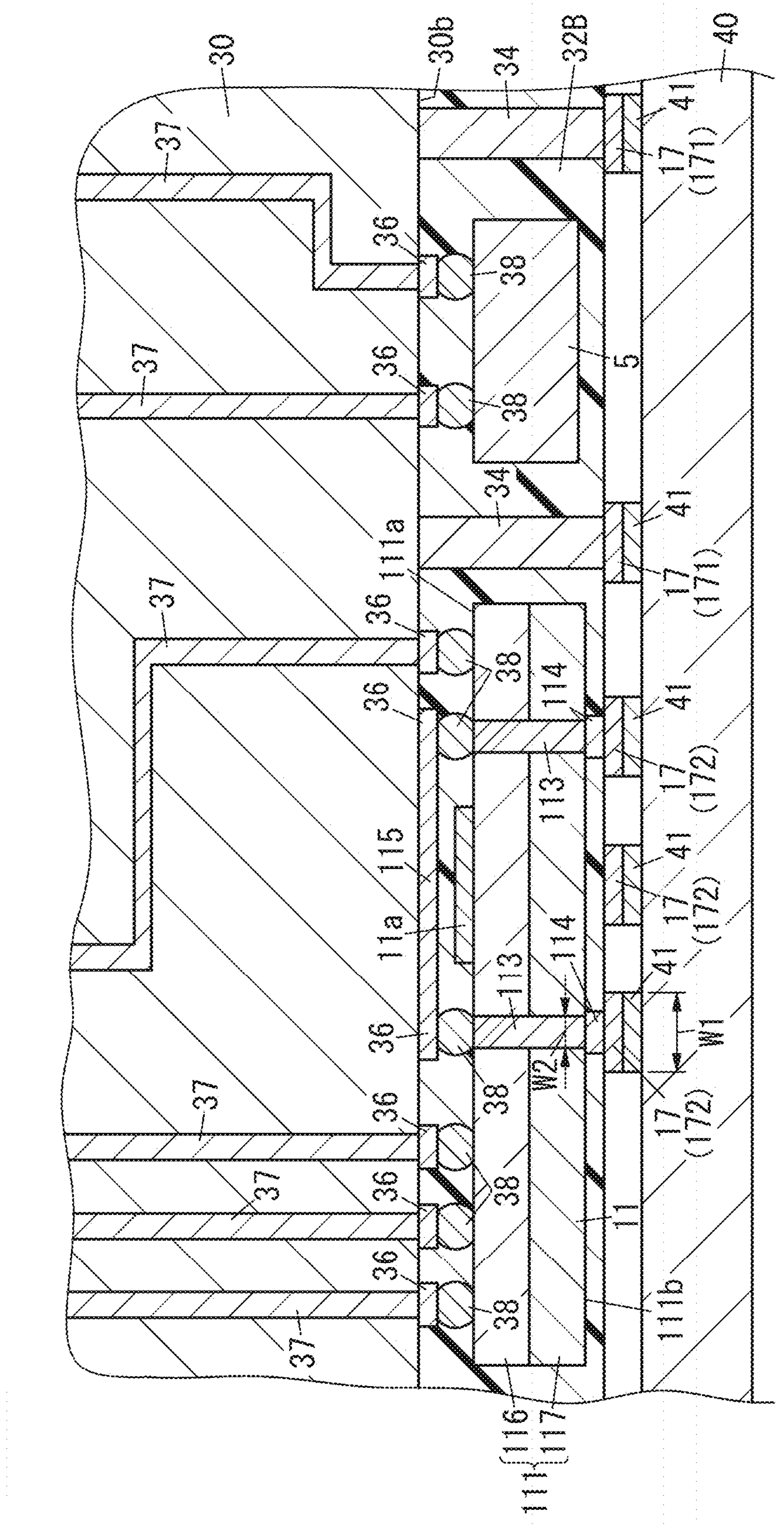
FIG. 10 is a sectional view of a main part of a high frequency module according to Modification Example 3.

As illustrated in FIG. 10, in Modification Example 3, in the above exemplary embodiment, a width W1 of the connection member 172 is larger than a width W2 of the through via 113 in a direction parallel to the main surface 111*a* of the power amplifier 11 in sectional view of a cross section intersecting (for example, orthogonal to) the main surface 30*b* of the mounting board 30 and including the through via 113 and the connection member 172. As a result, the thermal resistance can be reduced in a direction from the through via 113 toward the connection member 172. As a result, the heat dissipation performance of the power amplifier 11 can be further improved.

(4-4) Modification Example 4

Figure 11:
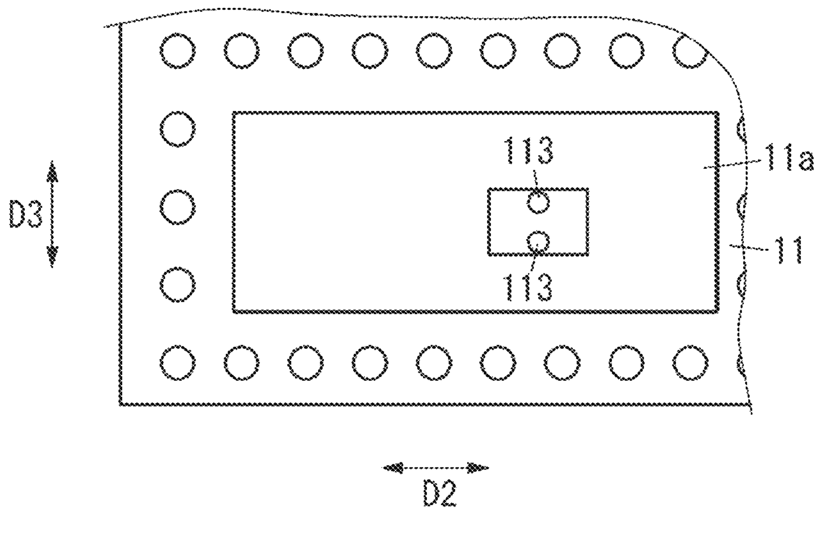
FIG. 11 is a plan view of a power amplifier viewed from a mounting board side in Modification Example 4.
Figure 12:
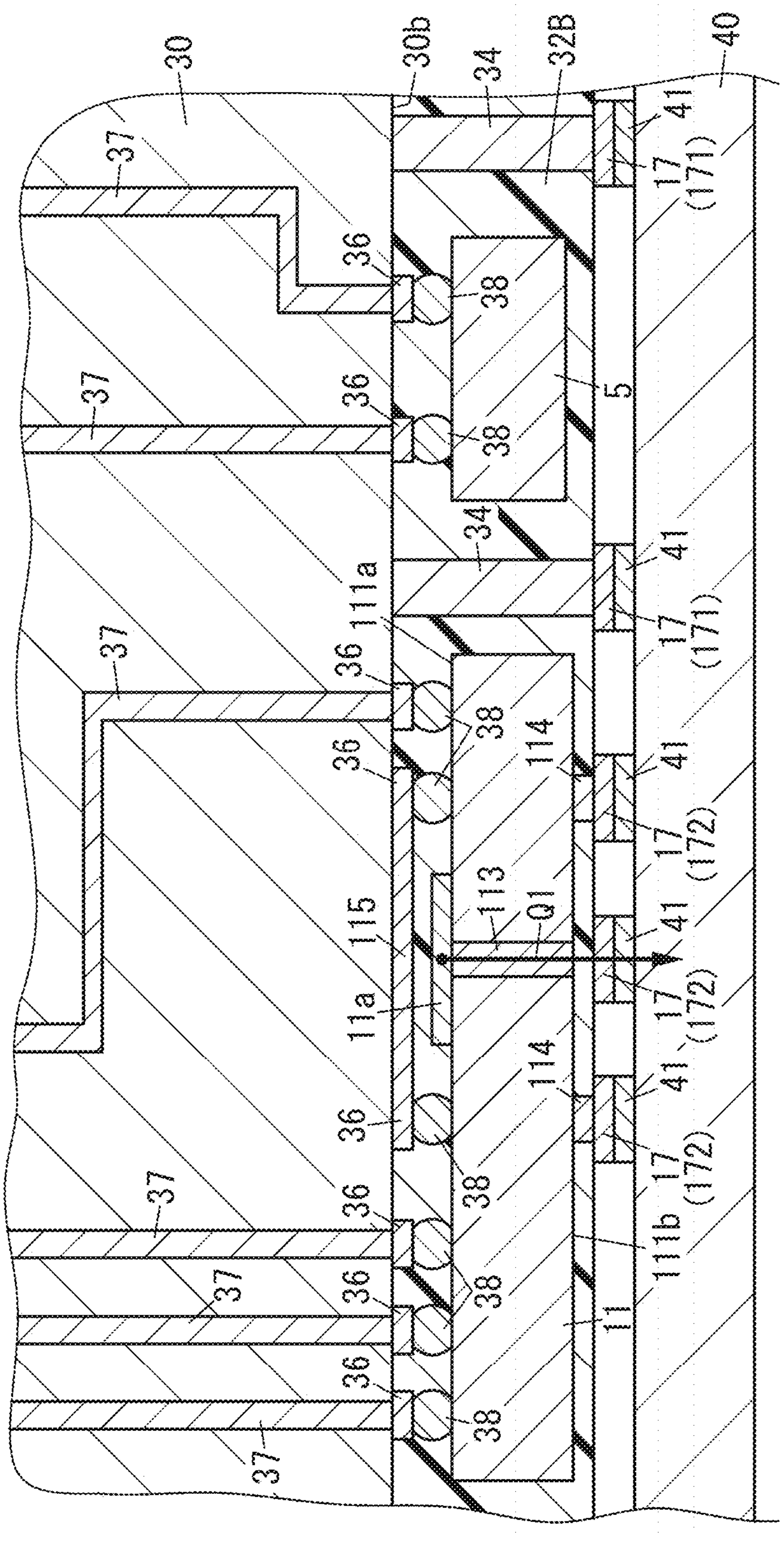
FIG. 12 is a sectional view of a main part of a high frequency module according to Modification Example 4.

In the above exemplary embodiment, the through vias 113 are disposed on both sides of the transistor 11*a* in plan view in the thickness direction D1 of the mounting board 30 (see FIGS. 3 and 4). However, as illustrated in FIG. 11, the through vias 113 may be disposed to overlap the transistor 11*a* in plan view seen from the thickness direction D1 of the mounting board 30. In this case, as illustrated in FIG. 12, the upper end surface of the through via 113 (the main surface on the main surface 111*a* side of the power amplifier 11) is in contact with the transistor 11*a*. Further, similarly to the above exemplary embodiment, the lower end surface of the through via 113 (the main surface on the main surface 111*b* side of the power amplifier 11) is connected to the connection member 172 (17) with the metal member 114 interposed therebetween.

In Modification Example 4, as illustrated in FIG. 12, the heat Q1 generated from the transistor 11*a* is efficiently (that is, rapidly) dissipated to the external board 40 through the through via 113, the metal member 114, and the connection member 172 (17). That is, the heat Q1 generated in the transistor 11*a* can be efficiently (that is, rapidly) dissipated to the external board 40 through the through via 113. As a result, the heat dissipation performance of the power amplifier 11 can be further improved.

(4-5) Modification Example 5

As illustrated in FIG. 4, in the above exemplary embodiment, the external connection terminal 34 is disposed between adjacent electronic components among the plurality of electronic components (the power amplifier 11, the second switch 5, the low noise amplifier 12, and the duplexer 10) mounted on the main surface 30*b* of the mounting board 30.

In Modification Example 5, the external connection terminal 34 disposed between the power amplifier 11 and the second switch 5 is connected to a ground. More specifically, the external connection terminal 34 disposed between the power amplifier 11 and the second switch 5 is connected to a ground layer of the external board 40 with the connection member 17 and the external board 40 interposed therebetween. As a result, the external connection terminal 34 disposed between the power amplifier 11 and the second switch 5 functions as an electromagnetic shielding member.

As a result, isolation between the power amplifier 11 and the second switch 5 can be ensured by the external connection terminal 34.

Similarly, the external connection terminal 34 disposed between the second switch 5 and the low noise amplifier 12 may also be connected to the ground. Further, the external connection terminal 34 disposed between the low noise amplifier 12 and the duplexer 10 may also be connected to the ground.

(4-6) Modification Example 6

As illustrated in FIG. 4, in the above exemplary embodiment, the external connection terminals 34 are disposed on both sides, for example, in the second direction D2 of each of the plurality of electronic components (the power amplifier 11, the second switch 5, the low noise amplifier 12, and the duplexer 10) mounted on the main surface 30*b* of the mounting board 30 in plan view seen from the thickness direction D1 of the mounting board 30.

In Modification Example 6, the external connection terminals 34 (second external connection terminals) on both sides of the power amplifier 11 in the second direction D2 are connected to the ground. More specifically, the external connection terminals 34 on both sides of the power amplifier 11 in the second direction D2 are connected to the ground layer of the external board 40 with the connection member 171 and the external board 40 interposed therebetween. As a result, isolation can be ensured on both sides of the power amplifier 11 in the second direction D2. That is, it is possible to suppress propagation of noise emitted from the power amplifier 11 to both sides of the power amplifier 11 in the second direction D2. Further, external noise entering the power amplifier 11 from both sides of the power amplifier 11 in the second direction D2 can be suppressed.

In Modification Example 6, the external connection terminals 34 on both sides of the power amplifier 11 in the second direction D2 are connected to the ground. However, instead of connecting the external connection terminals 34 on both sides of the power amplifier 11 in the second direction D2 to the ground, the external connection terminals 34 (second external connection terminals) on both sides of the power amplifier 11 in the third direction D3 may be connected to the ground. Further, both the external connection terminals 34 on both sides of the power amplifier 11 in the second direction D2 and the external connection terminals 34 on both sides of the power amplifier 11 in the third direction D3 may be connected to the ground.

Similarly, the external connection terminals 34 (second external connection terminals) on both sides of the second switch 5 in the second direction D2 may be connected to the ground. Further, the external connection terminals 34 (second external connection terminals) on both sides of the second switch 5 in the third direction D3 may be connected to the ground. Similarly, the external connection terminals 34 on both sides of each of the low noise amplifier 12 and the duplexer 10 in the second direction D2 may be connected to the ground. Further, the external connection terminals 34 on both sides of each of the low noise amplifier 12 and the duplexer 10 in the third direction D3 may be connected to the ground.

(4-7) Modification Example 7

In the above exemplary embodiment, the external connection terminal 34 (first external connection terminal) may be disposed between the power amplifier 11 and an electronic component of a reception system disposed on the main surface 30*b* of the mounting board 30. In this case, the external connection terminal 34 disposed between the power amplifier 11 and the electronic component of the reception system is connected to the ground as in Modification Example 2. The electronic component of the reception system (first electronic component) is an electronic component connected to a reception path through which the reception signal that is received by the antenna 3 passes. The reception path is a signal path that connects the antenna terminal 34A and the signal output terminal 34D. For example, in the circuit in FIG. 1, the electronic components of the reception system are the low noise amplifier 12, the duplexers 9 and 10, the transmission and reception filter 8, and the like. The power amplifier 11 is an electronic component of a transmission system. The electronic component of the transmission system is an electronic component connected to a transmission path through which the transmission signal passes. The transmission path is a signal path that connects the antenna terminal 34A and the signal input terminals 34B and 34C. According to Modification Example 7, isolation between the electronic component of the transmission system (power amplifier 11) and the electronic component of the reception system (first electronic component) can be ensured.

(4-8) Modification Example 8

Figure 13:
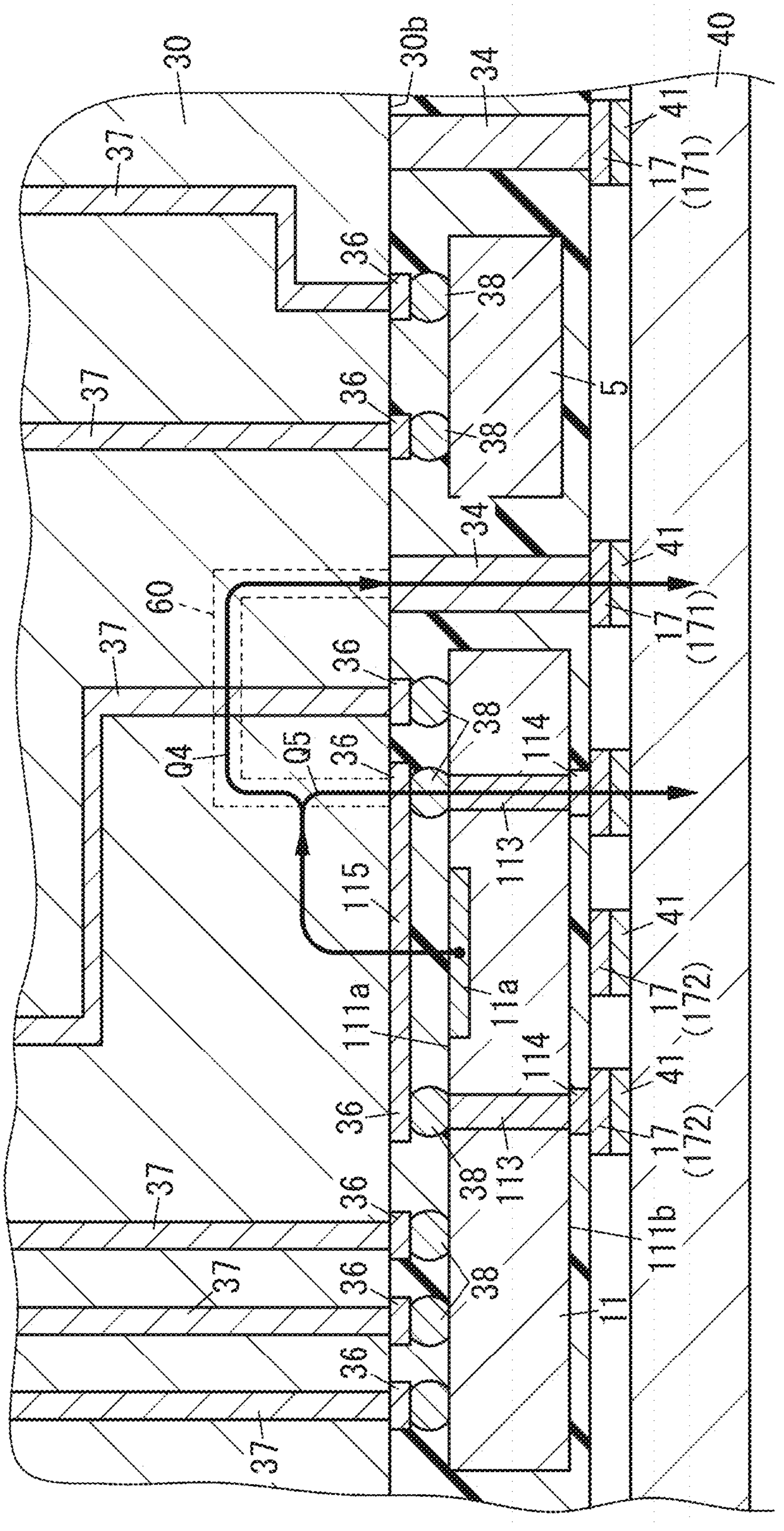
FIG. 13 is a sectional view of a main part of a high frequency module according to Modification Example 8.

As illustrated in FIG. 13, a high frequency module 1 in Modification Example 8 further includes a conductor path 60 in the above exemplary embodiment.

The conductor path 60 is a member that connects the metal member 38 (first metal member) and the external connection terminal 34 (first external connection terminal) to each other in the mounting board 30. The conductor path 60 is formed of a member (for example, copper or a copper alloy) having higher thermal conductivity than the mounting board 30. The conductor path 60 can suppress transfer of the heat Q4, which is transferred from the transistor 11*a* to the inside of the mounting board 30 through the resin layer 32B and transferred to the external connection terminal 34 side, to the second switch 5 (see FIG. 13).

The metal member 38 (for example, a solder bump) is a member that connects the power amplifier 11 and the second pad 36 on the main surface 30*b* of the mounting board 30. In Modification Example 8, the conductor path 60 is connected to the metal member 38 with the second pad 36 interposed therebetween. Further, the above-mentioned metal member 38 is connected to the through via 113 of the power amplifier 11. For example, the metal member 38 is a metal member closest to the transistor 11*a* or is a metal member adjacent to the transistor 11*a* in plan view seen from the thickness direction D1 of the mounting board 30, among the plurality of metal members 38 for connecting the power amplifier 11 and the second pad 36. The external connection terminal 34 is disposed between the power amplifier 11 and the first electronic component (for example, the second switch 5).

In Modification Example 8, part of heat Q4 (hereinafter, referred to as heat Q4) generated in the power amplifier 11 (for example, the transistor 11*a*) is transferred to the inside of the mounting board 30 through the resin layer 32B, diffuses in a direction parallel to the main surface 30*b* of the mounting board 30, and is transferred to the second switch 5 side. The heat Q4 transferred to the second switch 5 side is efficiently (rapidly) transferred to the external connection terminal 34 disposed between the power amplifier 11 and the second switch 5 through the conductor path 60 and is dissipated to the external board 40 through the external connection terminals 34. As a result, transfer of the heat Q4, which is transferred to the second switch 5 side, to the second switch 5 and influencing the second switch 5 can be suppressed. Further, heat Q5 that is part of the heat Q4 reached the conductor path 60 (hereinafter, referred to as heat Q5) is transferred to the metal member 38 through the conductor path 60. The heat Q5 is dissipated to the external board 40 through the metal member 38, the through via 113, the metal member 114, and the connection member 172 (17). As a result, the heat Q5 that is part of the heat Q4 transferred to the inside of the mounting board 30 can be rapidly dissipated to the outside (external board 40) through the through via 113. By efficiently dissipating the heat Q5 to the outside (external board 40) through the through via 113, a flow rate of the heat Q4 transferred to the external connection terminal 34 through the conductor path 60 can be suppressed, and as a result, the influence of the heat Q4 on the second switch 5 can be further suppressed.

(5) Aspect

The following exemplary aspects are disclosed in the present specification.

A high frequency module (1) of a first exemplary aspect includes a mounting board (30), a power amplifier (11), and a connection member (172). The mounting board (30) has a first main surface (30*a*) and a second main surface (30*b*) facing each other. The power amplifier (11) is disposed on the second main surface (30*b*) of the mounting board (30). The connection member (172) is connectable to an external board (40). The power amplifier (11) includes a base material (111), a transistor (11*a*), and a through via (113). The base material (111) has a third main surface (111*a*) and a fourth main surface (111*b*) facing each other, and the third main surface (111*a*) is disposed between the second main surface (30*b*) and the fourth main surface (111*b*). The transistor (11*a*) is disposed on the third main surface (111*a*) of the base material (111). The through via (113) is provided in the base material (111) along a facing direction in which the third main surface (111*a*) faces the fourth main surface (111*b*). The through via (113) is connected to the connection member (172).

According to this configuration, the power amplifier (11) is disposed on the second main surface (30*b*) (a main surface on a connection member (172) side) of the mounting board (30). As a result, a heat dissipation path, through which heat generated in the transistor (11*a*) is transferred to the external board (40), can be shortened as compared with the case where the power amplifier (11) is disposed on the first main surface (30*a*) of the mounting board (30). Further, the heat generated in the transistor (11*a*) of the power amplifier (11) can be dissipated to an outside (the external board (40) connected to the connection member (172)), through the through via (113) and the connection member (172). As a result, the heat generated in the transistor (11*a*) can be efficiently (that is, rapidly) dissipated to the outside (external board (40)). Accordingly, a heat dissipation performance of the power amplifier (11) can be improved.

In the high frequency module (1) of a second exemplary aspect according to the first aspect, the power amplifier (11) is disposed on the second main surface (30*b*) of the mounting board (30) with a first metal member (38) interposed therebetween. The first metal member (38) is connected to the third main surface (111*a*) of the power amplifier (11).

According to this configuration, heat (Q3) transferred from the transistor (11*a*) of the power amplifier (11) to the mounting board (30) can be rapidly returned from the mounting board (30) to the power amplifier (11) through the first metal member (38). As a result, the heat (Q3) transferred from the power amplifier (11) to the mounting board (30) can be rapidly dissipated to the external board (40) through the first metal member (38) and the through via (113).

The high frequency module (1) of a third exemplary aspect according to the second aspect includes a second metal member (115). The second metal member (115) is disposed on the second main surface (30*b*) of the mounting board (30) in a region facing the transistor (11*a*). The second metal member (115) is connected to the first metal member (38).

According to this configuration, the heat (Q3) transferred from the transistor (11*a*) to the mounting board (30) can be rapidly transferred to the first metal member (38) through the second metal member (115). As a result, the heat (Q3) transferred from the power amplifier (11) to the mounting board (30) can be rapidly dissipated to the external board (40) through the first metal member (38) and the through via (113).

In the high frequency module (1) of a fourth exemplary aspect according to the second or third aspect, a plurality of first metal members (38) are provided. A first metal member (38) closest to the transistor (11*a*) among the plurality of first metal members (38) is connected to the through via (113).

According to this configuration, the heat (Q3) transferred from the transistor (11*a*) to the mounting board (30) can be transferred to the through via (113) of the power amplifier (11) through the shortest path. As a result, the heat dissipation performance of the power amplifier (11) can be improved.

In the high frequency module (1) of a fifth exemplary aspect according to any one of the first to fourth aspects, the transistor (11*a*) is a final stage transistor of the power amplifier (11).

According to this configuration, the heat generated from the final stage transistor of the power amplifier (11) can be rapidly dissipated to the external board (40).

In the high frequency module (1) of a sixth exemplary aspect according to any one of the first to fifth aspects, a plurality of through vias (113) are provided. The plurality of through vias (113) are disposed on both sides of the transistor (11*a*) in plan view seen from a thickness direction (D1) of the mounting board (30).

According to this configuration, the heat (Q2, Q3) generated in the transistor (11*a*) can be more rapidly transferred from a third main surface (111*a*) side of the power amplifier (11) to a fourth main surface (111*b*) side.

The high frequency module (1) of a seventh exemplary aspect according to any one of the first to sixth aspects further includes a wiring layer (50). The wiring layer (50) has a fifth main surface (50*a*) and a sixth main surface (50*b*) facing each other, and the fifth main surface (50*a*) is disposed between the second main surface (30*b*) of the mounting board (30) and the sixth main surface (50*b*). The connection member (172) is disposed on the sixth main surface (50*b*) of the wiring layer (50).

According to this configuration, the wiring layer (50) can improve a degree of freedom in relative disposition of the connection member (172) with respect to the through via (113).

The high frequency module (1) of an eighth exemplary aspect according to any one of the first to seventh aspects further includes a controller (IC chip 19). The controller (IC chip 19) is disposed on the first main surface (30*a*) of the mounting board (30) and controls the power amplifier (11). The controller (IC chip 19) and the power amplifier (11) overlap each other in plan view seen from a thickness direction of the mounting board (30).

According to this configuration, a wiring path between the controller (IC chip 19) and the power amplifier (11) can be shortened as compared with the case where the controller (IC chip 19) and the power amplifier (11) are disposed not to overlap each other in plan view seen from the thickness direction (D1) of the mounting board (30).

The high frequency module (1) of a ninth exemplary aspect according to any one of the first to eighth aspects further includes an output matching circuit (13). The output matching circuit (13) is disposed on the first main surface (30*a*) of the mounting board (30) and is connected to an output portion of the power amplifier (11). The output matching circuit (13) and the power amplifier (11) overlap each other in plan view seen from a thickness direction (D1) of the mounting board (30).

According to this configuration, a wiring path between the output matching circuit (13) and the power amplifier (11) can be shortened as compared with the case where the output matching circuit (13) and the power amplifier (11) are disposed not to overlap each other in plan view seen from the thickness direction (D1) of the mounting board (30).

In the high frequency module (1) of a tenth exemplary aspect according to any one of the first to ninth aspects, a width (W1) of the connection member (172) is greater than a width (W2) of the through via (113) in sectional view in a cross section intersecting the second main surface (30*b*) of the mounting board (30).

According to this configuration, thermal resistance can be reduced in a direction from the through via (113) toward the connection member (172). As a result, the heat dissipation performance of the power amplifier (11) can be improved.

In the high frequency module (1) of an eleventh exemplary aspect according to any one of the first to tenth aspects, the base material (111) of the power amplifier (11) includes a first substrate (116) and a second substrate (117). The first substrate (116) is made of a semiconductor material other than silicon, on which the transistor (11*a*) is disposed. The second substrate (117) is laminated to the first substrate (116) and is made of silicon. The first substrate (116) is disposed between the second main surface (30*b*) of the mounting board (30) and the second substrate (117). The through via (113) extends through at least one of the first substrate (116) and the second substrate (117).

According to this configuration, since the base material (111) of the power amplifier (11) includes the second substrate (117) made of silicon, the second substrate (117) can improve the heat dissipation performance of the power amplifier (11). Further, since the through via (113) extends through at least one of the first substrate (116) and the second substrate (117), the through via (113) can transfer the heat more efficiently in the substrate through which the through via (113) extends. Accordingly, the heat dissipation performance of the power amplifier (11) can be further improved.

In the high frequency module (1) of a twelfth exemplary aspect according to any one of the first to eleventh aspects, the through via (113) overlaps the transistor (11*a*) in plan view seen from a thickness direction (D1) of the mounting board (30).

According to this configuration, the heat generated in the transistor (11*a*) can be efficiently transferred to the through via (113). As a result, the heat dissipation performance of the power amplifier (11) can be further improved.

The high frequency module (1) of a thirteenth exemplary aspect according to any one of the first to twelfth aspects further includes a first electronic component (for example, the second switch 5) and a plurality of external connection terminals (34). The first electronic component (for example, the second switch 5) is disposed on the second main surface (30*b*) of the mounting board (30). The plurality of external connection terminals (34) are disposed on the second main surface (30*b*) of the mounting board (30). The plurality of external connection terminals (34) include a first external connection terminal (34) that is connected to the connection member (17). The first external connection terminal (34) is disposed between the power amplifier (11) and the first electronic component (for example, the second switch 5), on the second main surface (30*b*) of the mounting board (30).

According to this configuration, the power amplifier (11) is disposed on the second main surface (30*b*) (that is, a main surface on a connection member (17) side) of the mounting board (30). Therefore, a distance between the power amplifier (11) and the external board (40) connected to the connection member (17) can be shortened as compared with the case where the power amplifier (11) is disposed on the first main surface (30*a*) of the mounting board (30). Therefore, the heat (Q1) generated in the power amplifier (11) can be efficiently dissipated to the outside (the external board (40) connected to the connection member 17). As a result, a heat dissipation performance of the power amplifier (11) can be improved.

Further, the first external connection terminal (34) connected to the connection member (17) is disposed between the power amplifier (11) and the first electronic component (for example, the second switch 5) on the second main surface (30*b*) of the mounting board (30). Therefore, the heat (Q4) transferred from the power amplifier (11) to the mounting board (30) can be dissipated to the outside (the external board (40) connected to the connection member (17)) through the first external connection terminal (34) and the connection member (17). As a result, influence of the heat (Q4) generated in the power amplifier (11) on the first electronic component (for example, the second switch 5) can be suppressed.

Accordingly, the heat dissipation performance of the power amplifier (11) can be improved, and influence of the heat (Q4) generated in the power amplifier (11) on other electronic components (first electronic component) can be suppressed.

In the high frequency module (1) of a fourteenth exemplary aspect according to the thirteenth aspect, the power amplifier (11) is disposed on the second main surface (30*b*) of the mounting board (30) with a first metal member (38) interposed therebetween. The first external connection terminal (34) and the first metal member (38) are connected to each other with a conductor path (60) interposed therebetween, which is provided in the mounting board (30).

According to this configuration, the heat (Q4) transferred from the power amplifier (11) to the first metal member (38) can be rapidly transferred to the external connection terminal (34) through the conductor path (60).

In the high frequency module (1) of a fifteenth exemplary aspect according to the thirteenth or fourteenth aspect, the power amplifier (11) and the first electronic component (for example, the second switch 5) are disposed at positions adjacent to each other.

According to this configuration, influence of the heat (Q4) generated in the power amplifier (11) on the first electronic component (for example, the second switch 5) adjacent to the power amplifier (11) can be suppressed.

In the high frequency module (1) of a sixteenth exemplary aspect according to any one of the thirteenth to fifteenth aspects, the first electronic component (for example, the second switch 5) is connected to a reception path through which a reception signal passes.

According to this configuration, isolation between the power amplifier (11), which is an electronic component of a transmission system, and a first electrode component of a reception system (for example, the second switch 5) can be ensured by the external connection terminal (34).

In the high frequency module (1) of a seventeenth exemplary aspect according to any one of the thirteenth to sixteenth aspects, the first external connection terminal (34) is connected to a ground.

According to this configuration, the first external connection terminal (34) can function as an electromagnetic shielding member. As a result, the isolation between the power amplifier (11) and the first electronic component (for example, the second switch 5) can be ensured.

In the high frequency module (1) of an eighteenth exemplary aspect according to the seventeenth aspect, the plurality of external connection terminals (34) include a plurality of second external connection terminals (34) connected to the connection member (17). The plurality of second external connection terminals (34) are disposed on both sides of each of the power amplifier (11) and the first electronic component (for example, the second switch 5) in plan view seen from a thickness direction (D1) of the mounting board (30).

According to this configuration, isolation can be ensured on both sides of each of the first electronic component (for example, the second switch 5) and the power amplifier (11).

In the high frequency module (1) of a nineteenth exemplary aspect according to the seventeenth or eighteenth aspect, the plurality of external connection terminals (34) include a plurality of third external connection terminals (34) connected to the connection member (17). A second electronic component (for example, a low noise amplifier 12) disposed on the second main surface (30*b*) of the mounting board (30) is further included. The plurality of third external connection terminals (34) are disposed on both sides of the second electronic component (for example, the low noise amplifier 12) in plan view seen from a thickness direction (D1) of the mounting board (30).

According to this configuration, isolation can be ensured on both sides of the second electronic component (for example, the low noise amplifier 12).

A communication device (100) according to a twentieth exemplary aspect includes the high frequency module (1) according to any one of the first to nineteenth aspects, and a signal processing circuit (2). The signal processing circuit (2) processes a high frequency signal passing through the high frequency module (1).

According to this configuration, it is possible to provide the communication device (100) including the high frequency module (1) having the above effects.

REFERENCE SIGNS LIST

1 high frequency module
2 signal processing circuit
3 antenna
4 first switch
4*a* common terminal
4*b* selection terminal
4*c* selection terminal
5 second switch
5*a* common terminal
5*b* selection terminal
Sc selection terminal
6 third switch
6*a* common terminal
6*b* selection terminal
6*c* selection terminal
7 fourth switch
7*a* common terminal
7*b* selection terminal
7*c* selection terminal
8 transmission and reception filter
9, 10 duplexer
11 power amplifier
11*a* transistor
12 low noise amplifier
13 output matching circuit
14 to 16 matching circuit
17, 171, 172 connection member
18 controller
19 IC chip
21 RF signal processing circuit
22 baseband signal processing circuit
30 mounting board
30*a* main surface (first main surface)
30*b* main surface (second main surface)
32A, 32B resin layer
33 shield layer
34 external connection terminal (first external connection terminal, second external connection terminal, third external connection terminal)
34A antenna terminal
34B, 34C signal input terminal
34D signal output terminal
34E input terminal
35 first pad
36 second pad
37 via
38 metal member (first metal member)
40 external board
41 solder
50 rewiring layer (wiring layer)
50*a* main surface (fifth main surface)
50*b* main surface (sixth main surface)
51 conductor layer
52 substrate
53 via
60 conductor path
100 communication device
111 base material
111*a* main surface
111*b* main surface
113 through via
114 metal member
115 metal member (second metal member)
D1 first direction (thickness direction)
D2 second direction
D3 third direction
Q1 to Q5 heat

The invention claimed is:

1. A high frequency module comprising:

a mounting board that has a first main surface facing a second main surface;

a power amplifier that is disposed on the second main surface of the mounting board; and a connection member that is connectable to an external board, wherein the power amplifier includes a base material that has a third main surface facing a fourth main surface, the third main surface being disposed between the second main surface and the fourth main surface, a transistor that is disposed on the third main surface of the base material, and a through via that is provided in the base material and extends through at least a portion of the base material along a facing direction in which the third main surface faces the fourth main surface, and the through via is connected to the connection member.

2. The high frequency module according to claim 1, wherein the power amplifier is disposed on the second main surface of the mounting board with a first metal member interposed therebetween, and the first metal member is connected to the third main surface of the power amplifier.

3. The high frequency module according to claim 2, further comprising:

a second metal member that is disposed on the second main surface of the mounting board in a region facing the transistor, wherein the second metal member is connected to the first metal member.

4. The high frequency module according to claim 2, wherein the first metal member is one of a plurality of first metal members, and a first metal member closest to the transistor among the plurality of first metal members is connected to the through via.

5. The high frequency module according to claim 1, wherein the transistor is a final stage transistor of the power amplifier.

6. The high frequency module according to claim 1, wherein the through via is one of a plurality of through vias, and the plurality of through vias are disposed on both sides of the transistor in plan view seen from a thickness direction of the mounting board.

7. The high frequency module according to claim 1, further comprising:

a wiring layer that has a fifth main surface facing a sixth main surface, the fifth main surface being disposed between the second main surface of the mounting board and the sixth main surface, wherein the connection member is disposed on the sixth main surface of the wiring layer.

8. The high frequency module according to claim 1, further comprising:

a controller that is disposed on the first main surface of the mounting board and that controls the power amplifier, wherein the controller overlaps the power amplifier in a plan view seen from a thickness direction of the mounting board.

9. The high frequency module according to claim 1, further comprising:

an output matching circuit that is disposed on the first main surface of the mounting board and that is connected to an output portion of the power amplifier, wherein the output matching circuit overlaps the power amplifier overlap in a plan view seen from a thickness direction of the mounting board.

10. The high frequency module according to claim 1, wherein a width of the connection member is greater than a width of the through via in sectional view in a cross section intersecting the second main surface of the mounting board.

11. The high frequency module according to claim 1, wherein the base material of the power amplifier includes a first substrate that is made of a semiconductor material other than silicon and on which the transistor is disposed, and a second substrate that is laminated to the first substrate and that is made of silicon, the first substrate is disposed between the second main surface of the mounting board and the second substrate, and the through via extends through at least one of the first substrate and the second substrate.

12. The high frequency module according to claim 1, wherein the through via overlaps the transistor in a plan view seen from a thickness direction of the mounting board.

13. The high frequency module according to claim 1, further comprising:

a first electronic component that is disposed on the second main surface of the mounting board; and a plurality of external connection terminals that are disposed on the second main surface of the mounting board, wherein the plurality of external connection terminals include a first external connection terminal that is connected to the connection member, and the first external connection terminal is disposed between the power amplifier and the first electronic component on the second main surface of the mounting board.

14. The high frequency module according to claim 13, wherein the power amplifier is disposed on the second main surface of the mounting board with a first metal member interposed therebetween, and the first external connection terminal and the first metal member are connected to each other with a conductor path interposed therebetween, the conductor path being provided in the mounting board.

15. The high frequency module according to claim 13, wherein the power amplifier is adjacent to the first electronic component.

16. The high frequency module according to claim 13, wherein the first electronic component is connected to a reception path through which a reception signal passes.

17. The high frequency module according to claim 13, wherein the first external connection terminal is connected to a ground.

18. The high frequency module according to claim 17, wherein the plurality of external connection terminals include a plurality of second external connection terminals connected to the connection member, and the plurality of second external connection terminals are disposed on both sides of each of the power amplifier and the first electronic component in a plan view seen from a thickness direction of the mounting board.

19. The high frequency module according to claim 17, wherein the plurality of external connection terminals include a plurality of third external connection terminals connected to the connection member, the high frequency module further comprises:

a second electronic component that is disposed on the second main surface of the mounting board, and the plurality of third external connection terminals are disposed on both sides of the second electronic component in a plan view seen from a thickness direction of the mounting board.

20. A communication device comprising:

the high frequency module according to claim 1; and a signal processing circuit that processes a high frequency signal passing through the high frequency module.

* * * * *